US012278185B2

(12) United States Patent
Peng et al.

(10) Patent No.: US 12,278,185 B2
(45) Date of Patent: Apr. 15, 2025

(54) POWER DISTRIBUTION METHOD

(71) Applicant: TAIWAN SEMICONDUCTOR MANUFACTURING COMPANY, LTD., Hsinchu (TW)

(72) Inventors: Shih-Wei Peng, Hsinchu (TW); Te-Hsin Chiu, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 14 days.

(21) Appl. No.: 18/448,148

(22) Filed: Aug. 10, 2023

(65) Prior Publication Data

US 2023/0411300 A1 Dec. 21, 2023

Related U.S. Application Data

(62) Division of application No. 17/178,029, filed on Feb. 17, 2021.

(Continued)

(51) Int. Cl.
H01L 23/528 (2006.01)
H01L 23/00 (2006.01)
(Continued)

(52) U.S. Cl.
CPC .......... *H01L 23/5286* (2013.01); *H01L 23/50* (2013.01); *H01L 23/528* (2013.01);
(Continued)

(58) Field of Classification Search
CPC ............ H01L 25/0657; H01L 25/0652; H01L 25/043; H01L 25/071; H01L 25/074;
(Continued)

(56) References Cited

U.S. PATENT DOCUMENTS 10,607,938 B1 * 3/2020 Rubin ................. H01L 27/1211
2003/0146517 A1 * 8/2003 Lasky ................... H01L 23/535
257/E23.079
(Continued)

FOREIGN PATENT DOCUMENTS

JP 2018503262 2/2018
KR 1020040041656 9/2002
(Continued)

OTHER PUBLICATIONS

Office Action dated Aug. 12, 2022 from corresponding application No. KR 10-2021-0047940.
(Continued)

*Primary Examiner* — Younes Boulghassoul
*Assistant Examiner* — Quinton A Brasfield
(74) *Attorney, Agent, or Firm* — Hauptman Ham, LLP

(57) ABSTRACT

A method of forming an integrated circuit (IC) package includes constructing a first power distribution structure on a first die included in the IC package, thereby electrically connecting the first power distribution structure to a second power distribution structure positioned on a back side of the first die, and bonding a third power distribution structure to the first power distribution structure, the third power distribution structure being positioned on a back side of a second die.

20 Claims, 29 Drawing Sheets

Related U.S. Application Data

(60) Provisional application No. 63/018,028, filed on Apr. 30, 2020.

(51) Int. Cl.
  *H01L 23/50* (2006.01)
  *H01L 23/538* (2006.01)
  *H01L 27/06* (2006.01)
  *H10D 88/00* (2025.01)

(52) U.S. Cl.
  CPC .......... *H01L 23/5386* (2013.01); *H01L 24/94* (2013.01); *H10D 88/00* (2025.01)

(58) Field of Classification Search
  CPC .. H01L 25/0756; H01L 25/112; H01L 25/117; H01L 2224/08145; H01L 27/0688; H01L 23/5286; H01L 23/528–5286; H01L 23/49827; H01L 23/5384; H01L 23/481; H01L 29/4175; H01L 2225/06541–06544; H01L 2225/06548; H01L 21/76898
  See application file for complete search history.

(56) References Cited

U.S. PATENT DOCUMENTS

| | | | | |
|---|---|---|---|---|
| 2011/0304052 A1* | 12/2011 | Turner | ................... | G06F 30/394 257/E23.079 |
| 2012/0250443 A1* | 10/2012 | Saraswat | ............... | G06F 1/3275 365/226 |
| 2014/0151882 A1 | 6/2014 | Morimoto | | |
| 2015/0311159 A1* | 10/2015 | Hsieh | .................. | H01L 23/5384 257/737 |
| 2015/0357240 A1 | 12/2015 | Law et al. | | |
| 2016/0211241 A1* | 7/2016 | Law | ....................... | H03K 17/56 |
| 2017/0092621 A1* | 3/2017 | Das | ................... | H01L 23/53209 |
| 2017/0154850 A1 | 6/2017 | Kao et al. | | |
| 2018/0286800 A1* | 10/2018 | Kamal | ................ | H01L 23/5286 |
| 2018/0330992 A1 | 11/2018 | DeLaCruz et al. | | |
| 2019/0252353 A1* | 8/2019 | Lattard | ............... | H01L 23/5286 |
| 2019/0259702 A1* | 8/2019 | Jain | ...................... | H01L 23/5286 |
| 2020/0020635 A1 | 1/2020 | Chang | | |
| 2020/0043832 A1 | 2/2020 | Mohamed | | |
| 2020/0076424 A1* | 3/2020 | Dubey | ............... | H03K 17/6871 |
| 2021/0118805 A1 | 4/2021 | Sio | | |
| 2021/0143127 A1* | 5/2021 | Jain | ....................... | H01L 23/481 |

FOREIGN PATENT DOCUMENTS

| | | |
|---|---|---|
| KR | 20140111716 | 9/2014 |
| TW | 201931551 | 8/2019 |
| TW | 202008526 | 2/2020 |
| TW | 202013652 | 4/2020 |
| WO | 2016114878 | 7/2016 |
| WO | 2017149845 | 9/2017 |

OTHER PUBLICATIONS

Office Action dated Mar. 28, 2022 for corresponding case No. TW 11120303460. (pp. 1-5).

Notice of Allowance dated Jul. 9, 2023 for corresponding case No. KR 10-2021-0047940. (pp. 1-8).

* cited by examiner

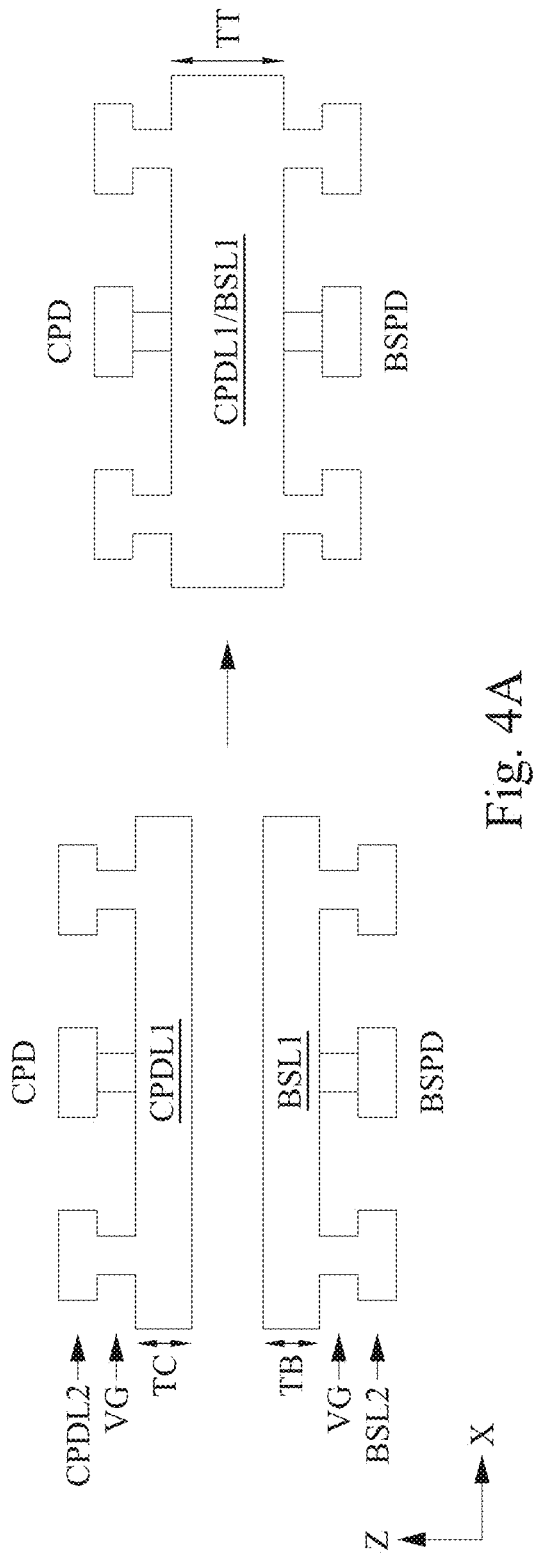
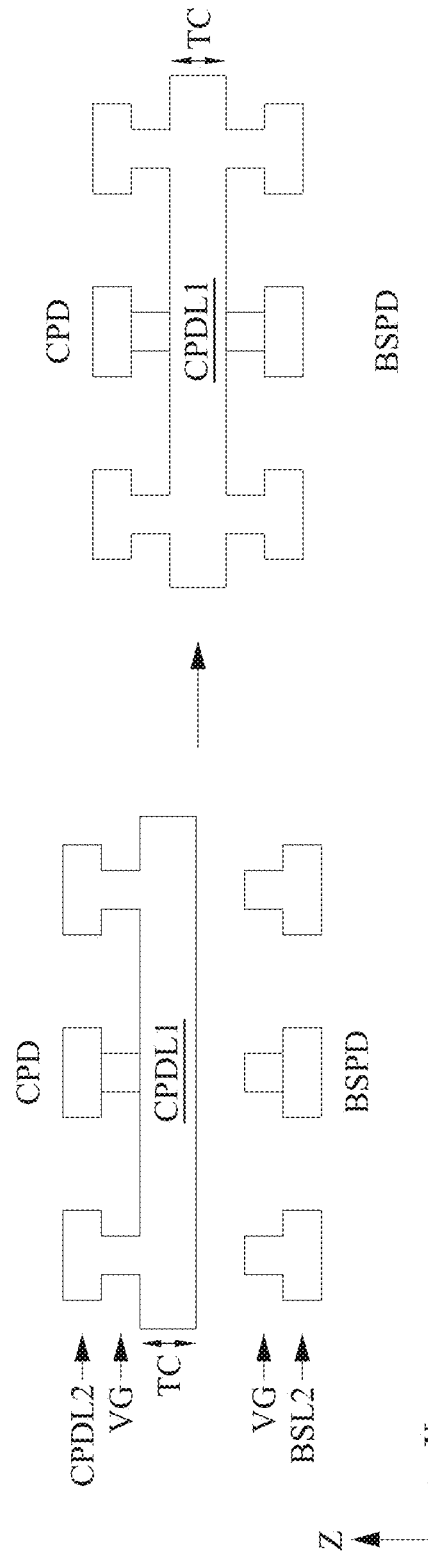
Fig. 4A
Fig. 4B

POWER DISTRIBUTION METHOD

PRIORITY CLAIM

The present application is a divisional application of U.S. application Ser. No. 17/178,029, filed Feb. 17, 2021, which claims the priority of U.S. Provisional Application No. 63/018,028, filed Apr. 30, 2020, each of which is incorporated herein by reference in its entirety.

BACKGROUND

Integrated circuits (ICs) on separate wafers are frequently combined in IC packages. IC package components commonly include combinations of individual dies, wafers, substrates, printed circuit boards (PCBs), interposers, solder bumps, through-vias, metal interconnects, and dielectric and molding materials. The IC package components are sometimes arranged as a stack in a 3DIC package or side-by-side in a fan-out configuration, often referred to as an integrated fan-out (InFO) 2.5D package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B are cross-sectional views of IC structures, in accordance with some embodiments.

DETAILED DESCRIPTION

Figure 1A:
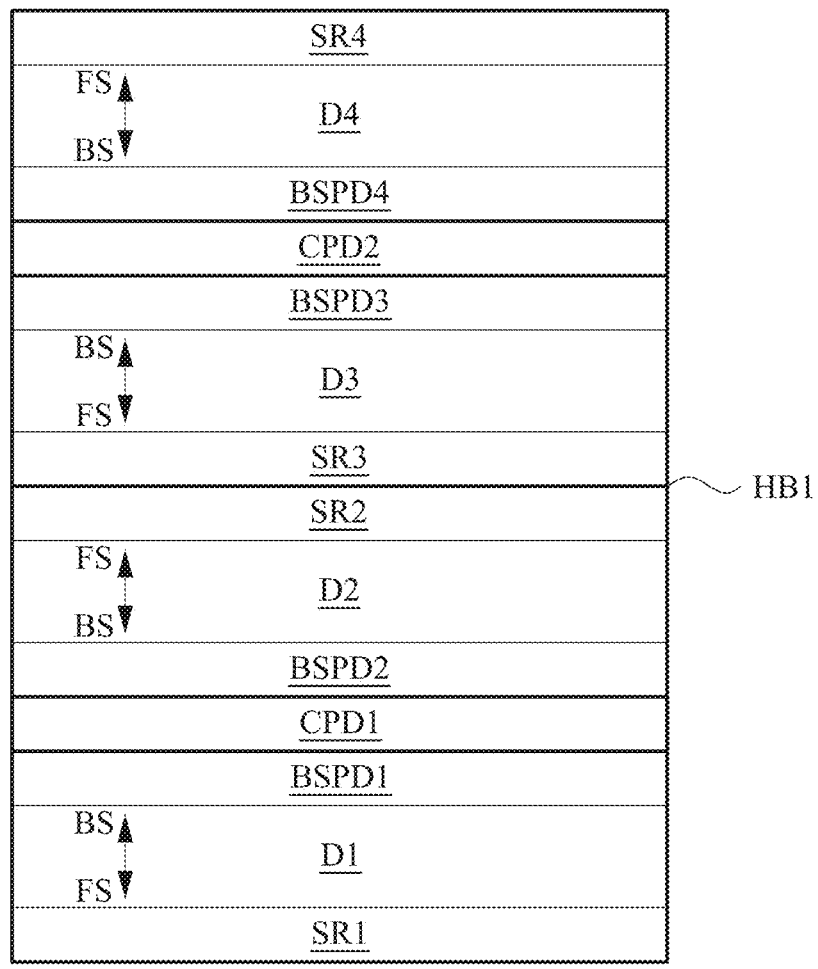
FIGS. 1A-1Cb are cross-sectional views of IC packages, in accordance with some embodiments.
Figure 1A:
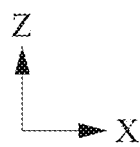

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC package includes a power distribution structure electrically connected to back side power distribution structures of each of at least two dies. Compared to approaches that do not include a power distribution structure electrically connected to back side power distribution structures of each of at least two dies, such IC packages are capable of having lower power distribution path resistance and greater arrangement flexibility.

Figure 1B:
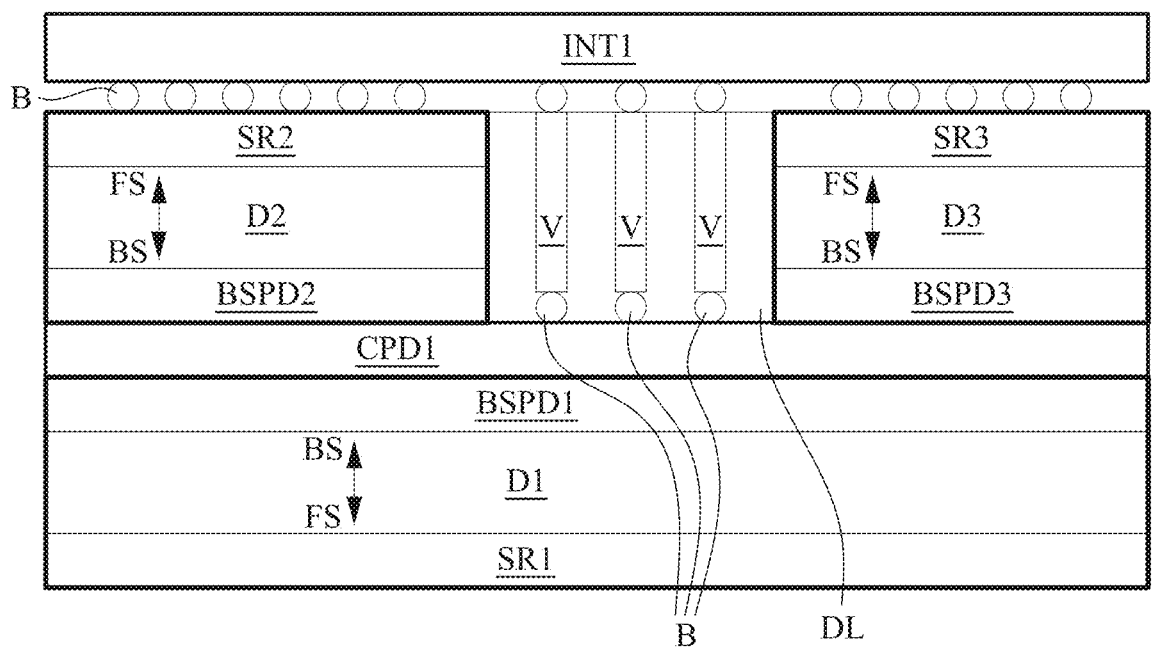
Figure 1B:
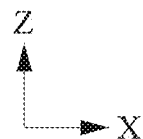
Figure 1C:
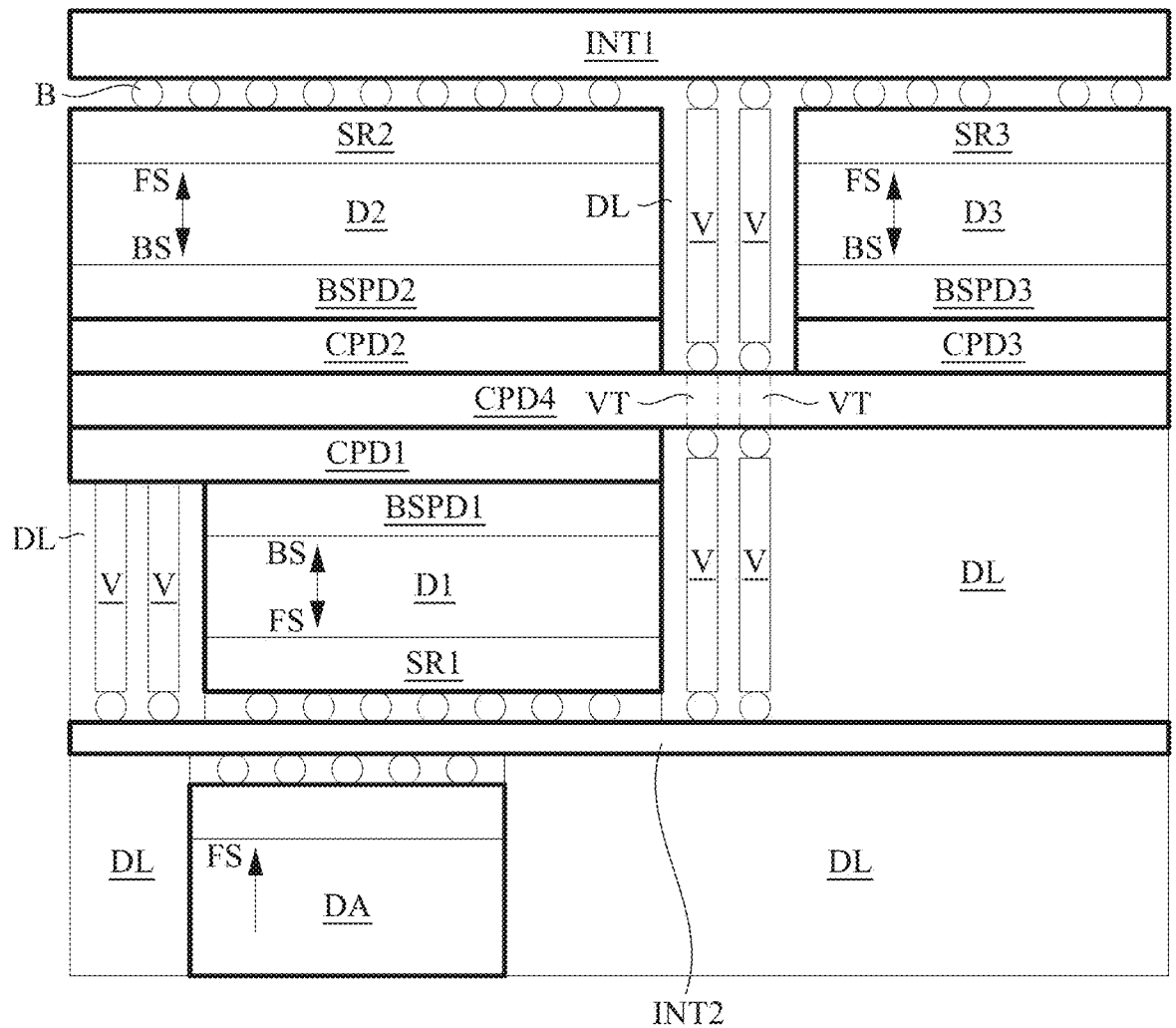
Figure 1C:
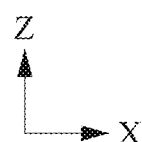
Figure 1C:
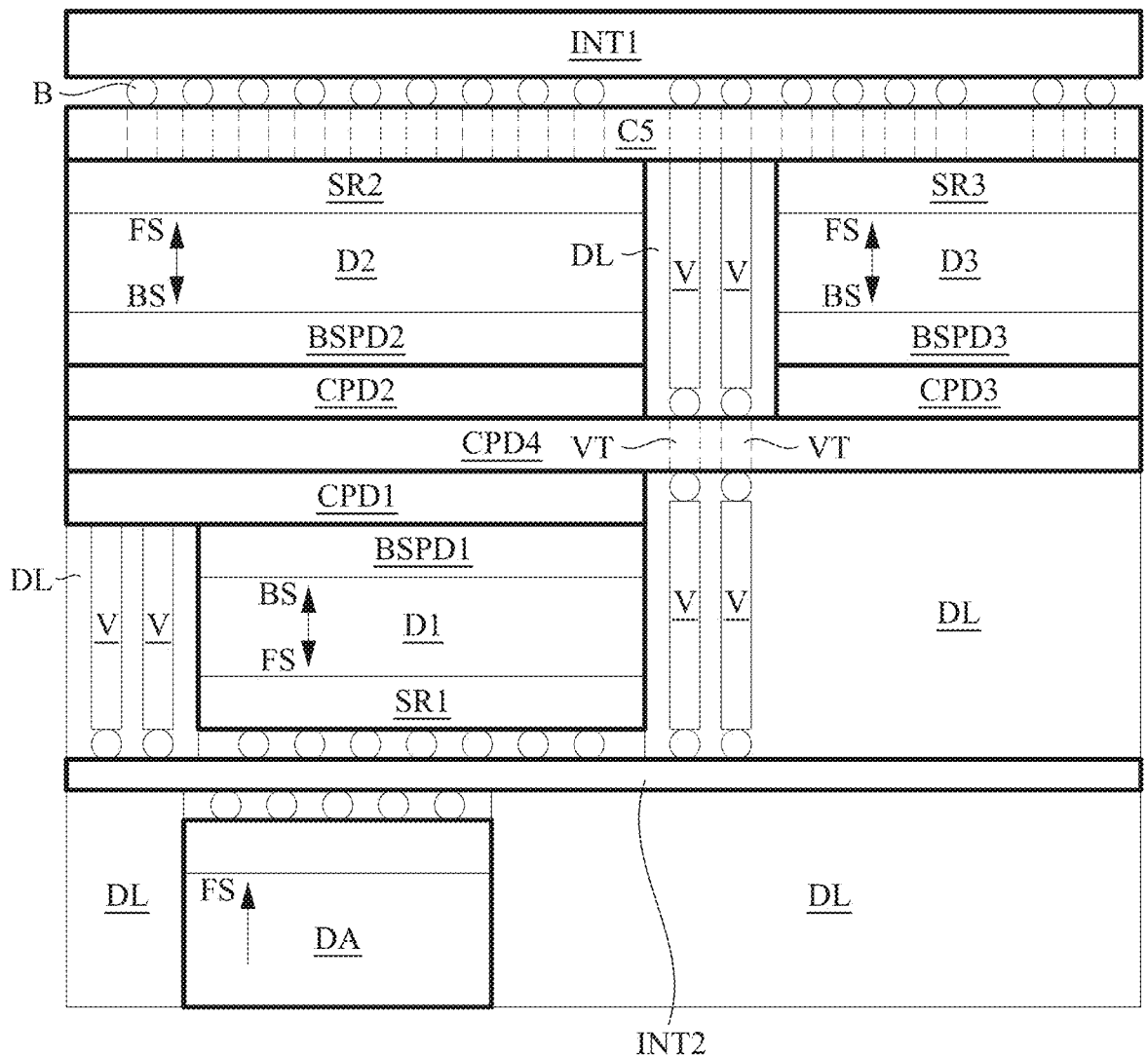

FIGS. 1A-1Cb are cross-sectional views of respective IC packages 100A-100C, in accordance with some embodiments. In addition to IC package 100A, 100B, or 100C, each of FIGS. 1A-1Cb also includes an X direction and a Z direction perpendicular to the X direction. In some embodiments, one or more of IC packages 100A, 100B, or 100C is manufactured in accordance with a method 800 of forming an IC package discussed below with respect to FIGS. 5A-8.

In various embodiments, each of FIGS. 1A-1Cb depicts elements of IC packages 100A-100C corresponding to a finished IC package or to an IC package in an unfinished manufacturing state. In various embodiments, IC package 100A corresponds to a finished or unfinished state of a manufacturing process illustrated in FIGS. 5A-5E, IC package 100B corresponds to a finished or unfinished state of a manufacturing process illustrated in FIGS. 6A-6E, and/or IC package 100C corresponds to a finished or unfinished state of a manufacturing process illustrated in FIGS. 7A-7G, each discussed below with respect to method 800 and FIG. 8.

Each of FIGS. 1A-1Cb is simplified for the purpose of illustration. The relative sizes, shapes, and positions of the elements depicted in FIGS. 1A-1Cb are non-limiting examples used to illustrate the embodiments discussed below. In various embodiments, one or more of IC packages 100A-100C includes one or more elements, e.g., dies, substrates, or insulation layers, in addition to the elements depicted in FIGS. 1A-1Cb that are not shown for the purpose of clarity.

In the embodiments depicted in FIGS. 1A-1Cb, each of IC packages 100A-100C includes some or all of dies D1-D4. A die, e.g., a die D1-D4 is a portion of a semiconductor wafer including one or more IC devices. In the embodiments depicted in FIGS. 1A-1Cb, each of dies D1-D4 represents a single die cut from a corresponding wafer. In various embodiments, one or more of IC packages 100A-100C includes one or more of dies D1-D4 representing an entire wafer or wafer portion including a plurality of dies that includes the corresponding die D1-D4.

In various embodiments, one or more of IC packages 100A-100C includes one or more dies in addition to the some or all of dies D1-D4 depicted in FIGS. 1A-1Cb, and/or one or more of IC packages 100A-100C includes fewer than the some or all of dies D1-D4 depicted in FIGS. 1A-1Cb.

In the embodiments depicted in FIGS. 1A-1Cb, each of IC packages 100A-100C includes one or more of power distribution structures CPD1-CPD4, further discussed below. In various embodiments, one or more of IC packages 100A-100C includes one or more power distribution structures in addition to the one or more of power distribution structures CPD1-CPD4 depicted in FIGS. 1A-1Cb. In some embodiments, IC package 100A does not include power distribution structure CPD2 depicted in FIG. 1A. In some embodiments, IC package 100C does not include one or more of power distribution structures CPD1-CPD4 depicted in FIGS. 1Ca and 1Cb.

Each of dies D1-D4 extends along the X direction and along a Y direction (not shown in FIGS. 1A-1Cb) perpendicular to the X and Z directions, and includes a front side FS and a back side BS, each extending in the X-Y plane. The front side FS of a given die, e.g., a die D1-D4, corresponds to a surface on which one or more IC devices are formed in a manufacturing process, and the back side BS corresponds to the opposing surface of the semiconductor wafer on which the one or more circuits are formed. In some embodiments, the back side BS of a given wafer corresponds to a surface resulting from a thinning operation. As depicted in FIGS. 1A-1Cb, each of dies D1-D4 is oriented either positively or negatively in the Z direction according to the corresponding front side FS and back side BS arrows.

The front side FS of each of dies D1-D4 includes the one or more IC devices (not shown) electrically connected to a corresponding signal routing structure SR1-SR4, and the back side BS of each of dies D1-D4 includes a corresponding back side power distribution structure BSPD1-BSPD4 electrically connected to the corresponding one or more IC devices. In some embodiments, a signal routing structure, e.g. a signal routing structure SR1-SR4, is considered to include the one or more IC devices.

In various embodiments, the one or more IC devices include one or a combination of a logic, signal, or application processor, a memory, a high-bandwidth memory (HBM), a system on an IC (SoIC), a transmitter and/or receiver, an application-specific IC (ASIC), a large-scale integration (LSI) or very large-scale integration (VLSI) circuit, a voltage or current regulator, or the like.

A signal routing structure, e.g., a signal routing structure SR1-SR4, includes a plurality of conductive segments supported and electrically separated by a plurality of insulation layers and arranged in accordance with functionality of the corresponding one or more IC devices. Conductive segments include conductive lines, vias, contact pads, and/or under-bump metallization (UBM) structures including one or more conductive materials, e.g., a metal such as copper, aluminum, tungsten, or titanium, polysilicon, or another material capable of providing a low resistance signal path. Insulation layers include one or more dielectric materials, e.g., silicon dioxide, silicon nitride, or one or more high-k dielectric materials, molding compounds, or other materials capable of electrically insulating adjacent conductive segments from each other.

A power distribution structure, e.g., a back side power distribution structure BSPD1-BSPD4 or power distribution structure CPD1-CPD4, also referred to as a power distribution network in some embodiments, includes a plurality of conductive segments supported and electrically separated by a plurality of insulation layers and arranged in accordance with power delivery requirements, e.g., of one or more IC devices of a corresponding front side FS. In various embodiments, a power distribution structure includes one or a combination of a through-silicon via (TSV), a through-dielectric via (TDV), a power rail, a super power rail, a buried power rail, conductive segments arranged in a grid or mesh structure, or another arrangement suitable for distributing power to one or more IC devices. In some embodiments, a power distribution structure includes one or more elements electrically isolated from power distribution elements and configured to provide one or more corresponding signal routing paths, e.g., via structures VT discussed below with respect to FIGS. 1Ca, 1Cb, 2B, 3B, and 7F. Non-limiting examples of power distribution structures are discussed below with respect to FIGS. 2A-4D.

In various embodiments, one or more of a signal routing structure, e.g., a signal routing structure SR1-SR4, or a power distribution structure, e.g., a back side power distribution structure BSPD1-BSPD4 or power distribution structure CPD1-CPD4, includes one or more conductive segments arranged as one or more of an inductive device or a capacitive device, e.g., a metal-insulator-metal (MIM) capacitor or a high density MIM (HDMIM) capacitor (not shown).

IC package 100A depicted in FIG. 1A includes dies D1-D4 aligned in the Z direction, and is referred to as a 3D IC 100A, an IC stack 100A, or a cube 100A in some embodiments. Each of dies D1 and D3 has a negative orientation in the Z direction corresponding to back side BS being aligned relative to front side FS in the positive Z direction, and each of dies D2 and D4 has a positive orientation in the Z direction corresponding to front side FS being aligned relative to back side BS in the positive Z direction.

Power distribution structure CPD1 is positioned between and electrically connects back side power distribution structure BSPD1 of die D1 to back side power distribution structure BSPD2 of die D2 by directly contacting each of back side power distribution structures BSPD1 and BSPD2. Power distribution structure CPD2 is positioned between and electrically connects back side power distribution structure BSPD3 of die D3 to back side power distribution structure BSPD4 of die D4 by directly contacting each of back side power distribution structures BSPD3 and BSPD4.

In the embodiment depicted in FIG. 1A, signal routing structure SR2 of die D2 is electrically connected to signal routing structure SR3 of die D3 at an interface HB1. In various embodiments, an interface, e.g., interface HB1, includes a hybrid bond structure, e.g., including a sealing layer, a plurality of solder bumps, or another structure capable of providing a plurality of electrical connections between adjacent signal routing structures, e.g., signal routing structures SR2 and SR3.

In some embodiments, IC package 100A does not include interface HB1, and signal routing structure SR2 of die D2 is electrically connected to signal routing structure SR3 of die D3 through one or more additional elements, e.g., a substrate, interposer, or one or more additional dies (not shown). In some embodiments, one or both of signal routing structure SR2 of die D2 or signal routing structure SR3 of die D3 is electrically connected to a back side power structure of an adjacent die through an interface (not shown).

In the embodiment depicted in FIG. 1A, IC package 100A thereby includes dies D1 and D2 arranged as a first pair of dies, and dies D3 and D4 arranged as a second pair of dies, the first and second pairs of dies electrically connected to each other, e.g., at interface HB1. In various embodiments, IC package 100A does not include one of the first or second pairs of dies, or includes one or more pairs of dies (not shown) in addition to the first and second pairs of dies and aligned with the first and second pairs of dies in the Z direction. In various embodiments, IC package 100A includes one or more individual dies (not shown) in addition to one or both of the first and second pairs of dies and aligned with the first and second pairs of dies in the Z direction.

In the embodiment depicted in FIG. 1A, IC package 100A includes each of power distribution structures CPD1 and CPD2 electrically connected to two back side power distribution structures. In various embodiments, IC package 100A includes one or more power distribution structures, e.g., power distribution structure CPD1 or CPD2, electrically connected to more than two back side power distribution structures, e.g., a back side power distribution structure of one or more dies (not shown) adjacent to one of dies D1-D4 in the X and/or Y direction.

By the configuration discussed above, IC package 100A includes some or all of dies D1-D4, each electrically connected to an adjacent one or more of dies D1-D4, the some or all of dies D1-D4 thereby being arranged as an electrically integrated assembly having a functional capability based on the some or all of dies D1-D4.

By including at least one power distribution structure CPD1 or CPD2 electrically connected to at least two back side power distribution structures, e.g., BSPD1 and BSPD2, or BSPD3 and BSPD4, IC package 100A is capable of having lower power distribution path resistance and greater arrangement flexibility compared to approaches that do not include a power distribution structure electrically connected to back side power distribution structures of each of at least two dies.

IC package 100B depicted in FIG. 1B includes die D1 aligned with each of dies D2 and D3 in the Z direction, and is referred to as an InFO package 100B in some embodiments. Die D1 has a negative orientation in the Z direction, and each of dies D2 and D3 has a positive orientation in the Z direction.

Power distribution structure CPD1 is positioned between and electrically connects back side power distribution structure BSPD1 of die D1 to each of back side power distribution structure BSPD2 of die D2 and back side power distribution structure BSPD3 of die D3 by directly contacting each of back side power distribution structures BSPD1, BSPD2, and BSPD3.

IC package 100B also includes a substrate INT1 aligned with each of dies D2 and D3 in the Z direction, an insulation layer DL positioned between dies D2 and D3 in the X direction and between die D1 and substrate INT1 in the Z direction. A plurality of via structures V extends through insulation layer DL in the Z direction.

A plurality of connecting bumps B includes a first subset (labeled) positioned between and electrically connecting power distribution structure CPD1 to the plurality of via structures V, a second subset positioned between and electrically connecting the plurality of via structures V to substrate INT1, a third subset positioned between and electrically connecting signal routing structure SR2 of die D2 to substrate INT1, and a fourth subset positioned between and electrically connecting signal routing structure SR3 of die D3 to substrate INT1.

A substrate, e.g., substrate INT1, is one or more rigid insulation layers including a plurality of conductive segments arranged to provide signal paths from a first side to a second side (not labeled) positioned further along the positive Z direction than the first side. In various embodiments, a first pitch of conductive segments arranged as first side electrical connections in the signal paths is the same as, or smaller or larger than a second pitch of conductive segments arranged as second side electrical connections in the signal paths. In some embodiments, an arrangement including the first pitch smaller or larger than the second pitch is referred to as a fan-out arrangement. In some embodiments, a substrate, e.g., substrate INT1, having a fan-out arrangement is referred to as an interposer, e.g., an interposer INT1. In some embodiments, a substrate includes some or all of a carrier wafer, e.g., a carrier wafer C1-C5 discussed below with respect to method 800 and FIGS. 5A-8.

A via structure, e.g., a via structure V, is a conductive segment extending through an insulation layer in a direction, e.g., the Z direction, perpendicular to a plane, e.g., the X-Y plane, in which conductive lines, e.g., conductive lines of power distribution structure CPD1, are arranged. In some embodiments, a via structure V is also referred to as a TSV V or a TDV V. In various embodiments, a cross-section of a via structure in a perpendicular plane has a circular, elliptical, square, rectangular, hexagonal, or other suitable two-dimensional shape.

A connecting bump, e.g., a connecting bump B, is a volume including one or more conductive materials configured to be capable of mechanically bonding and electrically connecting adjacent conductive surfaces, e.g., conductive segments of a power distribution structure such as power distribution structure CPD1 or signal paths such as signal paths of substrate INT1. In various embodiments, a connecting bump has a spherical, ellipsoidal, columnar, or other suitable three dimensional shape. In various embodiments, a connecting bump includes one or more of lead, copper, aluminum, tin, zinc, gold, or other suitable material. In some embodiments, a connecting bump is also referred to as a solder bump.

In the embodiment depicted in FIG. 1B, IC package 100B includes via structures V electrically connected to power distribution structure CPD1 through the first subset of connecting bumps B. In some embodiments, IC package 100B includes via structures V directly contacting power distribution structure CPD1, and thereby electrically connected to power distribution structure CPD1.

In the embodiment depicted in FIG. 1B, IC package 100B includes die D2 electrically connected to substrate INT1 through the third subset of connecting bumps B, and die D3 electrically connected to substrate INT1 through the fourth subset of connecting bumps B. In various embodiments, IC package 100B includes a single one of dies D2 and D3 electrically connected to substrate INT1, or includes one or more dies (not shown) in addition to dies D2 and D3 and electrically connected to substrate INT1 through one or more corresponding additional subsets of connecting bumps B.

In the embodiment depicted in FIG. 1B, IC package 100B includes back side power distribution structures BSPD1 of die D1, BSPD2 of die D2, and BSPD3 of die D3 electrically connected to power distribution structure CPD1. In various embodiments, IC package 100B includes a single one of back side power distribution structures BSPD2 of die D2 and BSPD3 of die D3 electrically connected to power distribution structure CPD1, or includes one or more additional back side power distribution structures of one or more corresponding additional dies (not shown) electrically connected to power distribution structure CPD1, i.e., aligned in the X and/or Y direction with die D1 or with dies D2 and D3.

In various embodiments, one or more of dies D1-D3 is included in a die stack, e.g., IC package 100A discussed above with respect to FIG. 1A, included in IC package 100B.

In the embodiment depicted in FIG. 1B, IC package 100B includes each of dies D2 and D3 positioned between and electrically connected to both substrate INT1 and power distribution structure CPD1 as discussed above. In various embodiments, IC package 100B includes a single one of dies D2 and D3 positioned between and electrically connected to both substrate INT1 and power distribution structure CPD1, or includes one or more dies (not shown) in addition to dies D2 and D3 positioned between and electrically connected to both substrate INT1 and power distribution structure CPD1.

In the embodiment depicted in FIG. 1B, IC package 100B includes power distribution structure CPD1 electrically connected to each of dies D1-D3 and plurality of via structures V. In various embodiments, IC package 100B includes power distribution structure CPD1 electrically connected to a subset of dies D1-D3 and plurality of via structures V, and one or more additional power distribution structures (not shown) electrically connected to one or more corresponding additional subsets of dies D1-D3 and plurality of via structures V.

In the embodiment depicted in FIG. 1B, IC package 100B includes an entirety of plurality of via structures V positioned between dies D2 and D3, thereby providing electrical connections between substrate INT1 and power distribution structure CPD1. In various embodiments, IC package 100B includes some or all of plurality of via structures V otherwise positioned relative to dies D2 and D3 so as to provide electrical connections between substrate INT1 and power distribution structure CPD1. In some embodiments, IC package 100B includes some or all of plurality of via structures V positioned so as to provide electrical connections between substrate INT1 and one or more power distribution structures (not shown) in addition to power distribution structure CPD1.

In the embodiment depicted in FIG. 1B, IC package 100B includes a total of three via structures V. In various embodiments, IC package 100B includes fewer or greater than three via structures V.

By the configuration discussed above, IC package 100B includes some or all of dies D1-D3 electrically connected to substrate INT1 through the at least one power distribution structure CPD1, the some or all of dies D1-D3 thereby being arranged as an electrically integrated assembly capable of receiving power through substrate INT1 and having a functional capability based on the some or all of dies D1-D3.

By including at least one power distribution structure CPD1 electrically connected to at least two back side power distribution structures, e.g., BSPD1 and BSPD2 or BSPD3, IC package 100B is capable of having lower power distribution path resistance and greater arrangement flexibility compared to approaches that do not include a power distribution structure electrically connected to back side power distribution structures of each of at least two dies.

IC package 100C depicted in FIGS. 1Ca and 1Cb, referred to as an InFO package 100C in some embodiments, includes dies D1-D3, substrate INT1, power distribution structure CPD1, and a first subset of via structures V extending through an insulation layer DL between dies D2 and D3, the elements being arranged in accordance with the various embodiments discussed above with respect to IC package 100B. In some embodiments, substrate INT1 of IC package 100C is referred to as a baseboard INT1.

In the embodiments depicted in FIGS. 1Ca and 1Cb, IC package 100C also includes power distribution structures CPD2-CPD4, a substrate INT2, a die DA, second and third subsets of via structures V, and additional insulation layers DL arranged as discussed below.

In the embodiment depicted in FIG. 1Ca, subsets of connecting bumps B contact substrate INT1 and either signal routing structure SR2 of die D2 or signal routing structure SR3 of die D3, IC package 100C thereby being configured to include signal path connections from substrate INT1 to signal routing structures SR2 and SR3. In the embodiment depicted in FIG. 1Cb, the subsets of connecting bumps B contact substrate INT1 and a carrier wafer C5 which contacts signal routing structure SR2 of die D2 and signal routing structure SR3 of die D3. Carrier wafer C5 includes a plurality of conductive paths, e.g., TSV and/or TDV structures (not labeled), and IC package 100C is thereby configured to include signal path connections from substrate INT1 to signal routing structures SR2 and SR3. Carrier wafer C5 is further discussed below with respect to method 800 and FIGS. 7A-8.

In the embodiment depicted in FIG. 1Ca, IC package 100C corresponds to a first case in which carrier wafer C5 is removed prior to substrate INT1 being attached, and in the embodiment depicted in FIG. 1Cb, IC package 100C corresponds to a second case in which carrier wafer C5 is not removed prior to substrate INT1 being attached, as discussed below with respect to FIGS. 7G and 8.

In the embodiments depicted in FIGS. 1Ca and 1Cb, power distribution structure CPD1 is positioned between and electrically connects back side power distribution structure BSPD1 of die D1 to power distribution structure CPD4 by directly contacting each of back side power distribution structure BSPD1 and power distribution structure CPD4; power distribution structure CPD2 is positioned between and electrically connects back side power distribution structure BSPD2 of die D2 to power distribution structure CPD4 by directly contacting each of back side power distribution structure BSPD2 and power distribution structure CPD4; and power distribution structure CPD3 is positioned between and electrically connects back side power distribution structure BSPD3 of die D3 to power distribution structure CPD4 by directly contacting each of back side power distribution structure BSPD3 and power distribution structure CPD4. Power distribution structure CPD4 is positioned between and electrically connects power distribution structure CPD1 to each of power distribution structures CPD2 and CPD3 by directly contacting each of power distribution structures CPD1-CPD3.

In some embodiments, IC package 100C does not include one or more of power distribution structures CPD1-CPD3, and power distribution structure CPD4 directly contacts, and is thereby electrically connected to, the corresponding one or more of back side power distribution structures BSPD1-BSPD3.

Power distribution structure CPD4 includes via structures VT positioned between and electrically connected through corresponding connecting bumps B to the first subset of via structures V and the second subset of via structures V positioned in an insulation layer DL adjacent to die D1 along the positive X direction. As discussed below with respect to FIGS. 2B and 3B, via structures VT are electrically isolated from power distribution elements of power distribution structure CPD4.

IC package 100C thereby includes the first and second subsets of via structures V, power distribution structure CPD4 including via structures VT, connecting bumps B, and carrier wafer C5 in the embodiment depicted in FIG. 1Cb, configured to provide signal routing paths between substrates INT1 and INT2 through power distribution structure CPD4 and electrically isolated from power distribution elements of power distribution structure CPD4. In some embodiments, IC package 100C includes one of both of the first or second subsets of via structures V directly contacting via structures VT, and thereby includes the first and second subsets of via structures V, power distribution structure CPD4, connecting bumps B if present, and carrier wafer C5 in the embodiment depicted in FIG. 1Cb, configured to provide signal routing paths between substrates INT1 and INT2 through power distribution structure CPD4 and electrically isolated from power distribution elements of power distribution structure CPD4.

The third subset of via structures V is positioned in an insulation layer DL adjacent to die D1 along the negative X direction, and is thereby electrically connected to power distribution structure CPD1 and substrate INT2. In some embodiments in which IC package 100C does not include power distribution structure CPD1, the third subset of via structures V is thereby electrically connected to power distribution structure CPD4 and substrate INT2.

The numbers of via structures V included in each of the first through third subsets depicted in FIGS. 1Ca and 1Cb are non-limiting examples provided for the purpose of illustration. In various embodiments, IC package 100C includes one or more of first through third subsets of via structures V having fewer or greater than the numbers depicted in FIGS. 1Ca and 1Cb. In various embodiments, IC package 100C does not include one or more of first through third subsets of via structures V. In some embodiments, a given one of the first through third subsets of via structures V is referred to as TSV V or TDV V.

Power distribution structure CPD4 is thereby electrically connected to substrate INT2 through the second subset of via structures V and corresponding connecting bumps B, and through power distribution structure CPD1, the third subset of via structures V, and corresponding connecting bumps B. Die D1, substrate INT2, and die DA are aligned in the Z direction, and substrate INT2 is electrically connected to die DA through corresponding connecting bumps B.

Compared to dies D1-D4 that include electrical connections on both front side FS and back side BS, die DA includes electrical connections solely on front side FS, the electrical connections including both signal and power distribution paths. In some embodiments, die DA is also referred to as a flip-chip DA, and substrate INT2 electrically connected to die DA through the corresponding connecting bumps B is referred to as a flip-chip arrangement.

In some embodiments, each of dies D1-D3 includes the one or more IC devices having feature sizes based on a first reference dimension, and die DA includes one or more IC devices having feature sizes based on a second reference dimension different from the first reference dimension. In some embodiments, the second reference dimension is larger than the first reference dimension.

In the embodiments depicted in FIGS. 1Ca and 1Cb, IC package 100C includes a single die DA electrically connected to substrate INT2. In some embodiments, IC package 100C includes one or more additional dies DA (not shown) electrically connected to substrate INT2.

By the configuration discussed above, IC package 100C includes some or all of dies D1-D3 electrically connected to substrate INT1 through at least one power distribution structure CPD4, and die DA electrically connected to substrate INT1 through substrate INT2 and, in some embodiments, via structures VT of power distribution structure CPD4. The some or all of dies D1-D3 and die DA are thereby arranged as an electrically integrated assembly capable of receiving power through substrate INT1 and having a functional capability based on the some or all of dies D1-D3 and die DA.

By including at least one power distribution structure CPD4 electrically connected to at least two back side power distribution structures, e.g., BSPD1 and BSPD2 or BSPD3, IC package 100C is capable of having lower power distribution path resistance and greater arrangement flexibility compared to approaches that do not include a power distribution structure electrically connected to back side power distribution structures of each of at least two dies.

FIGS. 2A-4D depict non-limiting examples of IC structures usable as combinations of portions of back side power distribution structures BSPD1-BSPD3 and/or power distribution structures CPD1-CPD4, in accordance with the various embodiments discussed above with respect to FIGS. 1A-1Cb. Each of FIGS. 2A-4D is simplified for the purpose of illustration. The numbers and relative sizes, shapes, and positions of the elements depicted in FIGS. 2A-4D are non-limiting examples used to illustrate the embodiments discussed below. In various embodiments, one or more of the IC structures depicted in FIGS. 2A-4D includes one or more elements, e.g., conductive lines, via structures, power rails, connective bumps, UBM structures, capacitive and/or inductive devices, or insulation layers, in addition to the elements depicted in FIGS. 2A-4D that are not shown for the purpose of clarity.

Figure 2A:
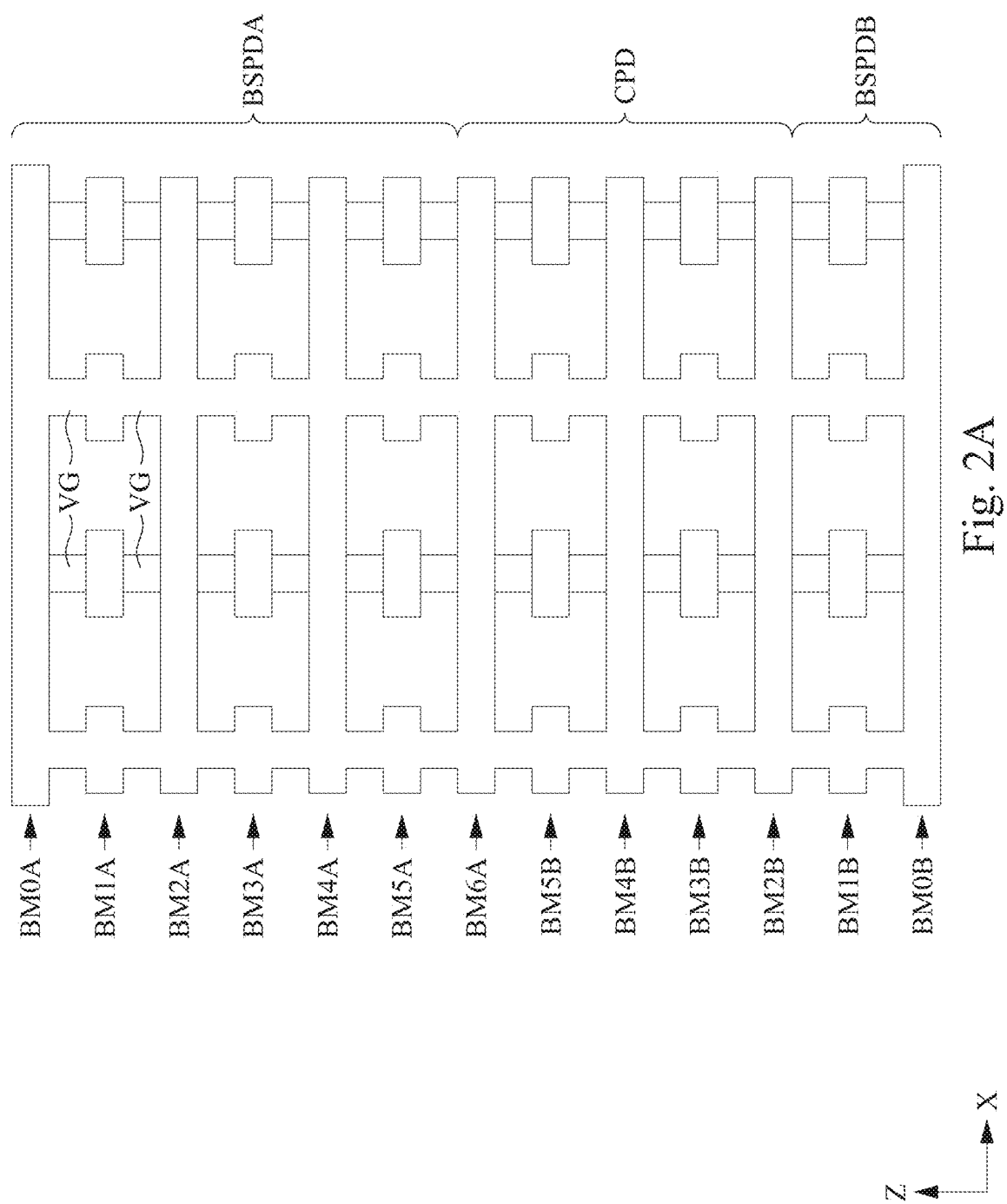
FIGS. 2A and 2B are cross-sectional views of IC structures, in accordance with some embodiments.
Figure 2B:
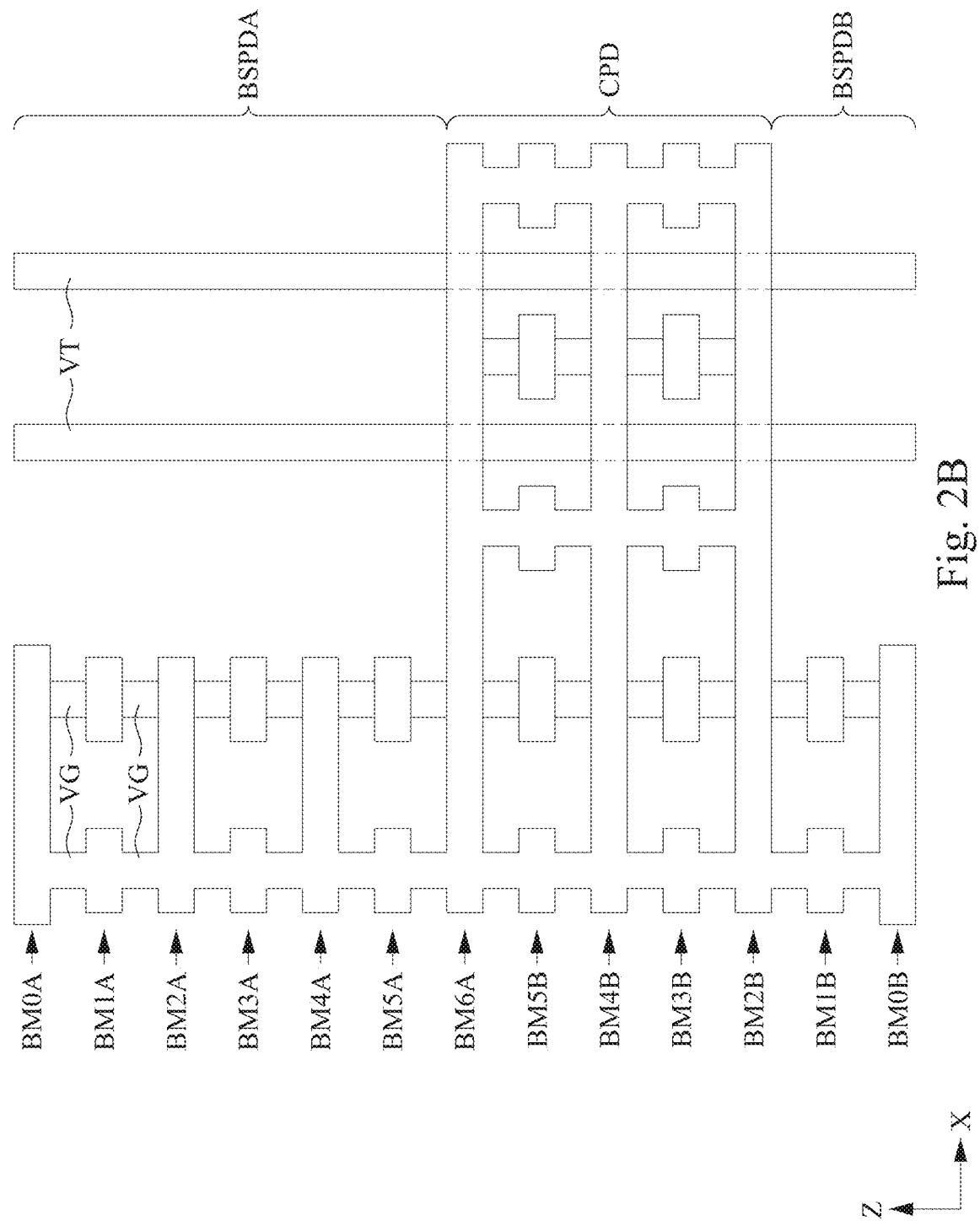

FIGS. 2A and 2B are cross-sectional views of IC structures, in accordance with one or more embodiments. Each of FIGS. 2A and 2B depicts a non-limiting example of an X-Z plane cross-section of a mesh structure including elements of power distribution structures BSPDA and BSPDB and a common power distribution structure CPD. Each of power distribution structures BSPDA and BSPDB is usable as some or all of back side power distribution structures BSPD1-BSPD3 and/or power distribution structures CPD1-CPD3, and common power distribution structure CPD is usable as some or all of power distribution structures CPD1-CPD4, each discussed above with respect to FIGS. 1A-1Cb.

Each of the mesh structures depicted in FIGS. 2A and 2B includes conductive lines BM0A, BM2A, BM4A, BM6A, BM4B, BM2B, and BM0B extending in the X direction and conductive lines BM1A, BM3A, BM5A, BM5B, BM3B, and BM1B extending in the Y direction (not shown). Via structures VG (a portion labeled) are positioned between and electrically connect subsets of the conductive lines of adjacent layers to each other, the subsets of conductive lines corresponding to distributed power voltage levels.

In the embodiments depicted in FIGS. 2A and 2B, IC structures are configured to distribute two power voltage levels, e.g., a ground voltage level and a power supply voltage level, and accordingly include two subsets of conductive lines in each layer. A first subset corresponds to the X-Z plane of the cross-sectional view and is indicated by the continuous boundary of conductive lines BM0A-BM0B and connecting via structures VG. A second subset corresponds to another X-Z plane (offset from the cross-sectional view X-Z plane in the Y direction) in which conductive lines BM0A, BM2A, BM4A, BM6A, BM4B, BM2B, and BM0B are not visible, and each of conductive lines BM1A, BM3A, BM5A, BM5B, BM3B, and BM1B and connecting via structures VG is indicated by an individual boundary. Plan views corresponding to FIGS. 2A and 2B are discussed below with respect to FIGS. 3A and 3B.

In some embodiments, an IC structure is configured to distribute more than two power voltage levels and includes more than two subsets of conductive lines and connecting via structures.

Conductive lines BM0A-BM0B include conductive materials, e.g., one or more metals, positioned in insulation layers (not shown) of an IC package, e.g., an IC package 100A-100C. In the embodiments depicted in FIGS. 2A and 2B, the layers including conductive lines BM0A-BM5A and corresponding connecting via structures VG are included in power distribution structure BSPDA, the layers including conductive lines BM6A-BM2B and corresponding connecting via structures VG are included in common power distribution structure CPD, and the layers including the conductive lines BM1B and BM0B and corresponding connecting via structures VG are included in power distribution structure BSPDB.

In some embodiments, the layers including conductive lines BM0A-BM5A are referred to as respective first through sixth back side metal layers of power distribution structure BSPDA, and the layers including conductive lines BM0B and BM1B are referred to as respective first and second back side metal layers of power distribution structure BSPDB. In various embodiments, the layers including conductive lines BM6A-BM2B are referred to as respective first through fifth or respective fifth through first back side metal layers of common power distribution structure CPD.

The numbers of layers of conductive lines in each of power distribution structures BSPDA and BSPDB and common power distribution structure CPD depicted in FIGS. 2A and 2B are non-limiting examples used to illustrate an IC structure. In various embodiments, one or more of power distribution structures BSPDA or BSPDB or common power distribution structure CPD includes one or more layers in addition to those depicted in FIGS. 2A and 2B, or does not include one or more of the layers depicted in FIGS. 2A and 2B.

In various embodiments, conductive lines in a layer of common power distribution structure CPD adjacent to a layer of one of power distribution structures BSPDA or BSPDB, e.g., conductive lines BM6A or BM2B, correspond to conductive lines CPDL1 discussed below with respect to FIGS. 4A-4D.

In the embodiment depicted in FIG. 2A, each of power distribution structures BSPDA and BSPDB and common power distribution structure CPD includes a same number of conductive lines BM0A-BM0B such that entireties of power distribution structures BSPDA and BSPDB and common power distribution structure CPD align in the Z direction. In various embodiments, power distribution structures BSPDA and BSPDB and common power distribution structure CPD include varying numbers of conductive lines BM0A-BM0B such that portions of one or more of power distribution structures BSPDA or BSPDB or common power distribution structure CPD align in the Z direction and other portions of one or more of power distribution structures BSPDA or BSPDB or common power distribution structure CPD extend beyond the other(s) of power distribution structures BSPDA or BSPDB or common power distribution structure CPD in the X and/or Y direction.

In the embodiment depicted in FIG. 2B, common power distribution structure CPD includes conductive lines BM6A-BM2B extending in the positive X direction beyond conductive lines BM0A-BM5A of power distribution structure BSPDA and conductive lines BM1B and BM0B of power distribution structure BSPDB.

In the embodiment depicted in FIG. 2B, via structures VT extend in the Z direction and between adjacent conductive lines BM6A-BM2B in the extended portion of common power distribution structure CPD. Via structures VT are electrically isolated from each of the subsets of conductive lines BM6A-BM2B and via structures VG corresponding to the two power voltage level configuration of common power distribution structure CPD, and are thereby configured to provide signal paths separate from the power voltage levels.

In the embodiment depicted in FIG. 2B, via structures VT extend into power distribution structures BSPDA and BSPDB, thereby corresponding to some or all of the first and second subsets of via structures V discussed above with respect to FIGS. 1Ca and 1Cb. In some embodiments, via structures VT do not extend into one or both of power distribution structures BSPDA or BSPDB, and via structures VT are electrically connected to the corresponding first or second subsets of via structures V by directly contacting the corresponding first or second subsets of via structures V or through corresponding connecting bumps B discussed above with respect to FIGS. 1Ca and 1Cb.

Figure 3A:
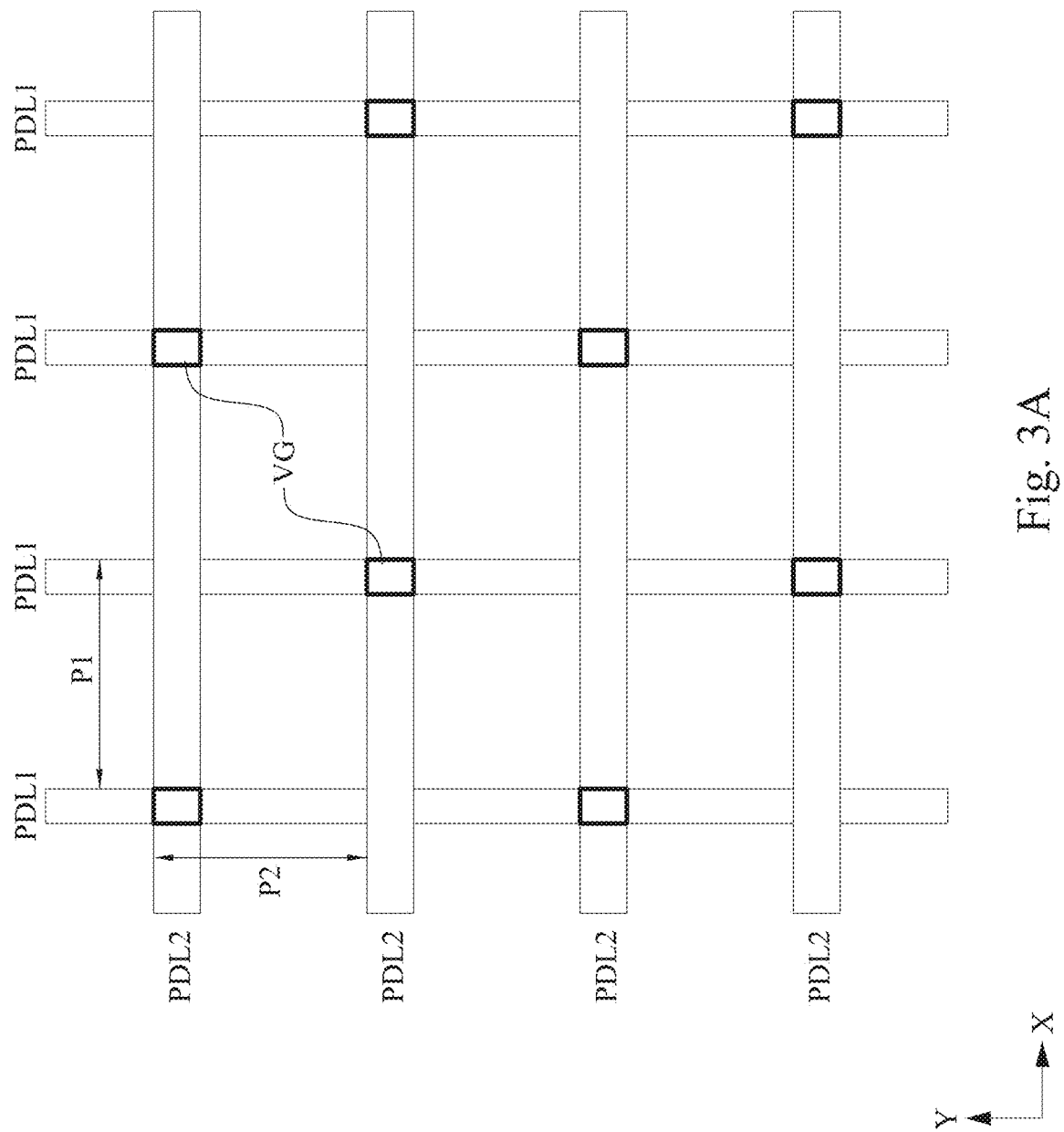
FIGS. 3A and 3B are plan views of IC structures, in accordance with some embodiments.
Figure 3B:
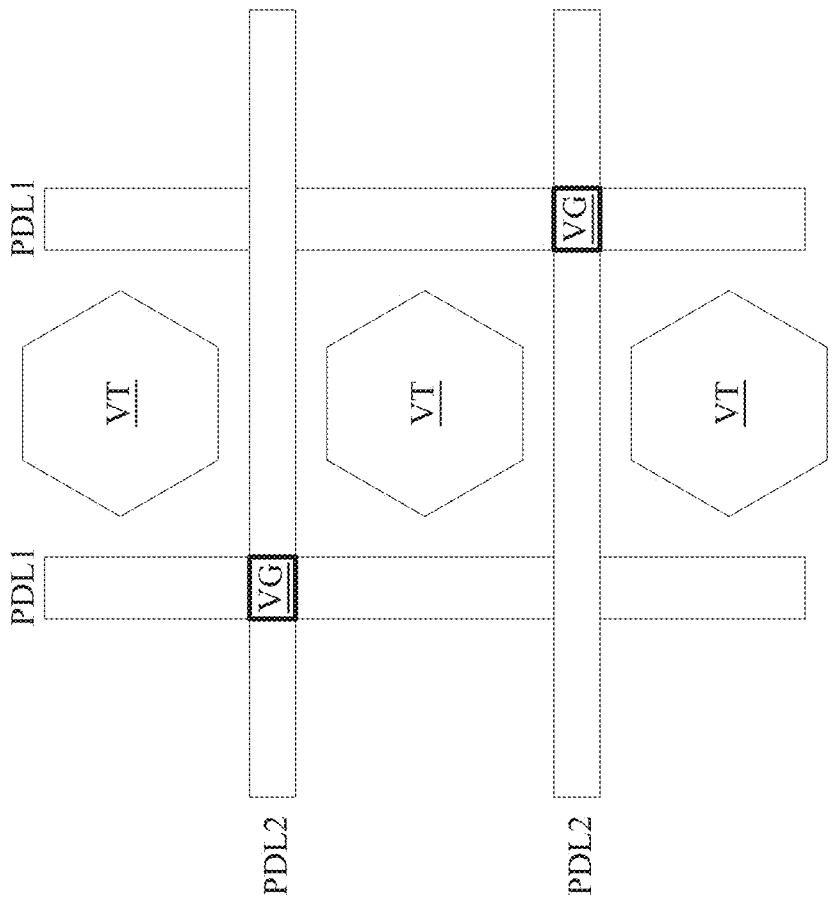

FIGS. 3A and 3B are plan views of IC structures, in accordance with one or more embodiments. Each of FIGS. 3A and 3B depicts a non-limiting example corresponding to adjacent layers of conductive lines of the mesh structures depicted in FIGS. 2A and 2B.

In the embodiments depicted in FIGS. 3A and 3B, conductive lines PDL1 extend in the Y direction, conductive lines PDL2 extend in the X direction and overlie conductive lines PDL1, and via structures VG are positioned between and electrically connect conductive lines PDL1 and PDL2 at subsets of locations at which conductive lines PDL2 overlie conductive lines PDL1. In some embodiments, conductive lines PDL1 extend in the X direction and conductive lines PDL2 extend in the Y direction.

Conductive lines PDL1 and PDL2 thereby correspond to adjacent layers of conductive lines, e.g., respective conductive lines BM0A and BM1A or respective conductive lines BM1A and BM0A, of a mesh structure configured to distribute two power voltage levels. In various embodiments, conductive lines PDL1 and PDL2 correspond to adjacent layers within one of power distribution structures BSPDA or BSPDB or common power distribution structure CPD, or to a layer of conductive lines within common power distribution structure CPD adjacent to a layer of conductive lines within one of power distribution structures BSPDA or BSPDB.

In the embodiment depicted in FIG. 3B, via structures VT are positioned between and electrically isolated from adjacent instances of each of conductive lines PDL1 and PDL2. Via structures VT are thereby configured to provide signal paths separate from the power voltage levels corresponding to conductive lines PDL1 and PDL2 and via structures VG.

In the embodiment depicted in FIG. 3B, via structures VT have a hexagonal shape in the X-Y plane. In various embodiments, via structures VT have one or more other shapes in the X-Y plane, e.g., circular, and are thereby positioned between and electrically isolated from adjacent instances of each of conductive lines PDL1 and PDL2.

As depicted in FIG. 3A, conductive lines PDL1 are spaced along the X direction according to a pitch P1, and conductive lines PDL2 are spaced along the Y direction according to a pitch P2. In various embodiments, a pitch, e.g., one of pitches P1 or P2, is equal to or is a multiple of a feature size corresponding to the one or more IC devices included in a die, e.g., a die D1-D4 discussed above with respect to FIGS. 1A-1Cb.

In some embodiments, one of conductive lines PDL1 or conductive lines PDL2 are included in a first back side metal layer, and the corresponding pitch P1 or P2 is equal to or is a multiple of a cell height of the one or more IC devices. In some embodiments, the cell height corresponds to an internal die spacing between adjacent power rails corresponding to two power voltage levels, and the one of conductive lines PDL1 or PDL2 is configured to distribute the two corresponding power voltage levels. In some embodiments, one of conductive lines PDL1 or conductive lines PDL2 are included in a back side metal layer above the first metal layer, and the corresponding pitch P1 or P2 is a multiple of the cell height.

In some embodiments, one of conductive lines PDL1 or conductive lines PDL2 are included in a back side metal layer above the first metal layer, and the corresponding pitch P1 or P2 is a multiple of a contact poly pitch of the one or more IC devices. In some embodiments, the contact poly pitch corresponds to an internal die spacing between contacts electrically connected to adjacent gate structures or gate structure multiples.

Figure 4C:
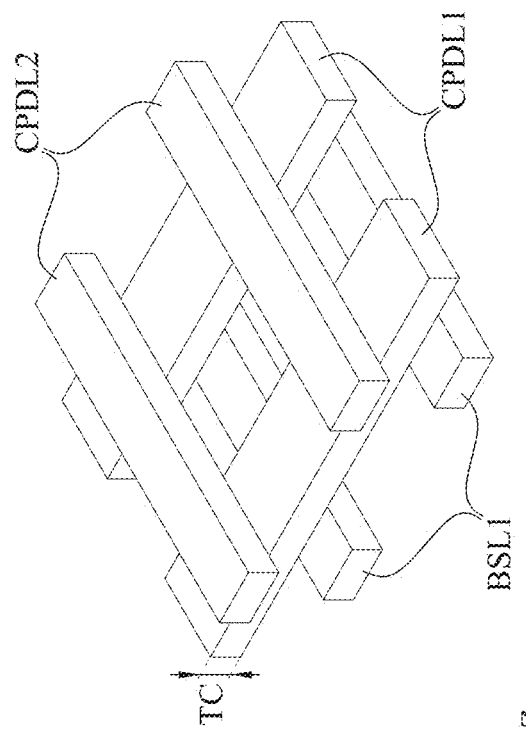
FIGS. 4C and 4D are perspective views of IC structures, in accordance with some embodiments.
Figure 4D:
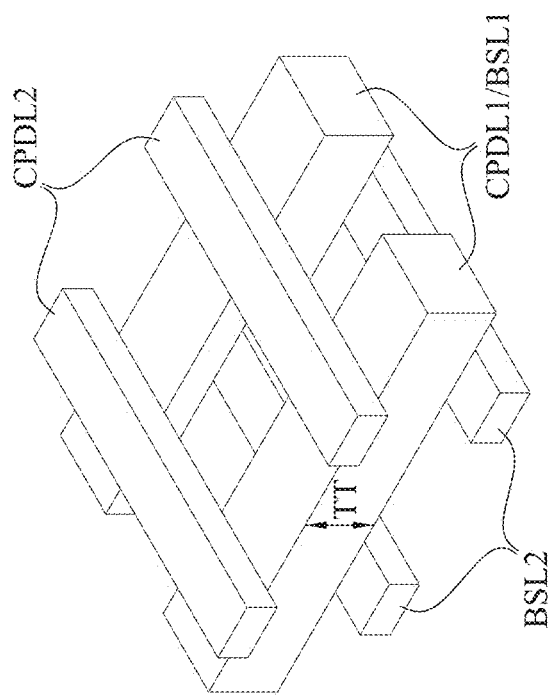

FIGS. 4A and 4B are cross-sectional views of IC structures, and FIGS. 4C and 4D are perspective views of IC structures, in accordance with some embodiments. Each of FIGS. 4A-4D depicts a non-limiting example of a junction between common power distribution structure CPD, discussed above with respect to FIGS. 2A and 2B, and a power distribution structure BSPD corresponding to one of power distribution structures BSPDA or BSPDB. Each of FIGS. 4A and 4B depicts common power distribution structure CPD and power distribution structure BSPD as separate structures on the left side of an arrow and as a combined structure on the right side of the arrow, and each of FIGS. 4C and 4D depicts the corresponding combined structure.

In each of the embodiments depicted in FIGS. 4A and 4B, common power distribution structure CPD includes a topmost layer (in the negative Z direction) of conductive lines CPDL1 extending in the X direction, a layer adjacent to the topmost layer including conductive lines CPDL2 extending in the Y direction, and via structures VG electrically connecting conductive lines CPDL1 to conductive lines CPDL2. Conductive lines CPDL1 have a thickness TC in the Z direction.

In the embodiment depicted in FIG. 4A, power distribution structure BSPD includes a topmost layer (in the positive Z direction) of conductive lines BSL1 extending in the X direction, a layer adjacent to the topmost layer including conductive lines BSL2 extending in the Y direction, and via structures VG electrically connecting conductive lines BSL1 to conductive lines BSL2. Conductive lines BSL1 have a thickness TB in the Z direction.

In the embodiment depicted in FIG. 4B, power distribution structure BSPD includes conductive lines BSL1 extending in the Y direction, and via structures VG electrically connected to conductive lines BSL1 and extending away from conductive lines BSL1 in the positive Z direction.

In the embodiment depicted in FIGS. 4A and 4C, the combined structure includes conductive lines CPDL1/BSL1 having a thickness TT in the Z direction. Conductive lines CPDL1/BSL1 correspond to conductive lines CPDL1 and BSL1 extending in the X direction and having a same pitch in the Y direction such that the combined structure includes electrical connections between topmost conductive lines of common power distribution structure CPD aligned with topmost conductive lines of power distribution structure BSPD. In some embodiments, one of conductive lines CPDL1 or BSL1 have a first pitch and the other of conductive lines CPDL1 or BSL1 have a second pitch equal to a multiple of the first pitch.

In some embodiments, thickness TT is approximately equal to a sum of thicknesses TC and TB. In some embodiments, thickness TT is less than the sum of thicknesses TC and TB.

In accordance with the embodiment depicted in FIGS. 4A and 4C, in the non-limiting example depicted in FIGS. 2A and 2B, either common power distribution structure CPD includes conductive lines BM6A corresponding to conductive lines CPDL1/BSL1 and power distribution structure BSPDA includes conductive lines BM5A corresponding to conductive lines BSL2, or common power distribution structure CPD includes conductive lines BM2B corresponding to conductive lines CPDL1/BSL1 and power distribution structure BSPDB includes conductive lines BM1B corresponding to conductive lines BSL2.

In the embodiment depicted in FIGS. 4B and 4D, the combined structure includes conductive lines CPDL1 having thickness TC. Conductive lines CPDL1 extend in the X direction and conductive lines BSL1 extend in the Y direction such that the combined structure includes electrical connections through via structures VG (not shown in FIG. 4D) between topmost conductive lines of common power distribution structure CPD orthogonal to topmost conductive lines of power distribution structure BSPD.

In the embodiment depicted in FIGS. 4B and 4D, the combined structure is based on power distribution structure BSPD including via structures VG extending from the topmost conductive lines. In various embodiments, a combined structure including electrical connections between topmost conductive lines of common power distribution structure CPD orthogonal to topmost conductive lines of power distribution structure BSPD is based on common power distribution structure CPD including via structures VG extending from the topmost conductive lines, or includes topmost conductive lines of common power distribution structure directly connected to topmost conductive lines of power distribution structure BSPD.

In accordance with the embodiment depicted in FIGS. 4B and 4D, in the non-limiting example depicted in FIGS. 2A and 2B, either common power distribution structure CPD includes conductive lines BM6A corresponding to conductive lines CPDL1 and power distribution structure BSPDA includes conductive lines BM5A corresponding to conductive lines BSL1, or common power distribution structure CPD includes conductive lines BM2B corresponding to conductive lines CPDL1 and power distribution structure BSPDB includes conductive lines BM1B corresponding to conductive lines BSL1.

An IC structure including common power distribution structure CPD configured in accordance with the various embodiments discussed above with respect to FIGS. 2A-4D is thereby capable of realizing the benefits discussed above with respect to IC packages 100A-100C. Further, in embodiments in which common power distribution structure CPD includes conductive lines having one or more pitches corresponding to one or more pitches of conductive lines in one or both of power distribution structures BSPDA or BSPDB, common power distribution structure CPD is able to be manufactured using a same process as one used to manufacture the one or both of power distribution structures BSPDA or BSPDB.

Figure 7A:
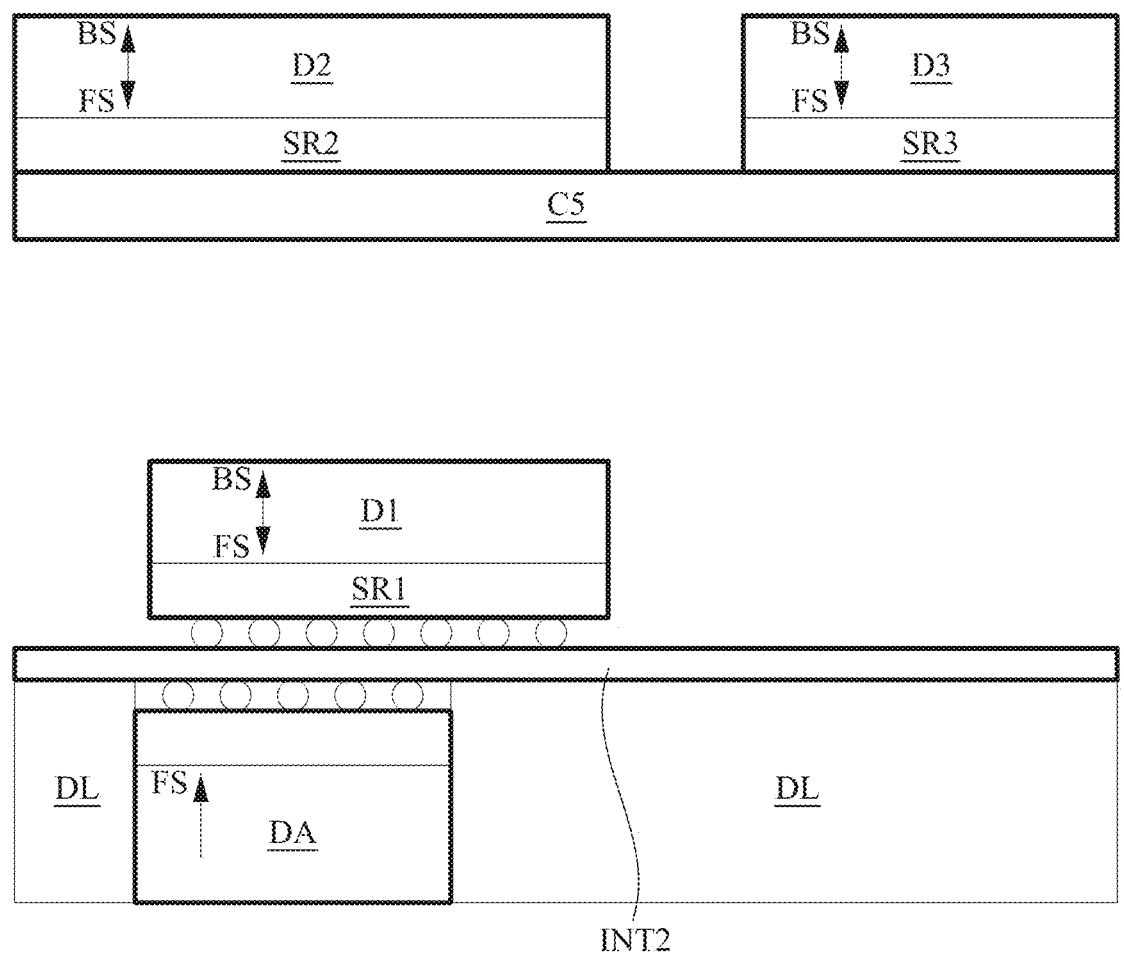
FIGS. 7A-7G are cross-sectional views of intermediate stages in the formation of an IC package, in accordance with some embodiments.
Figure 7B:
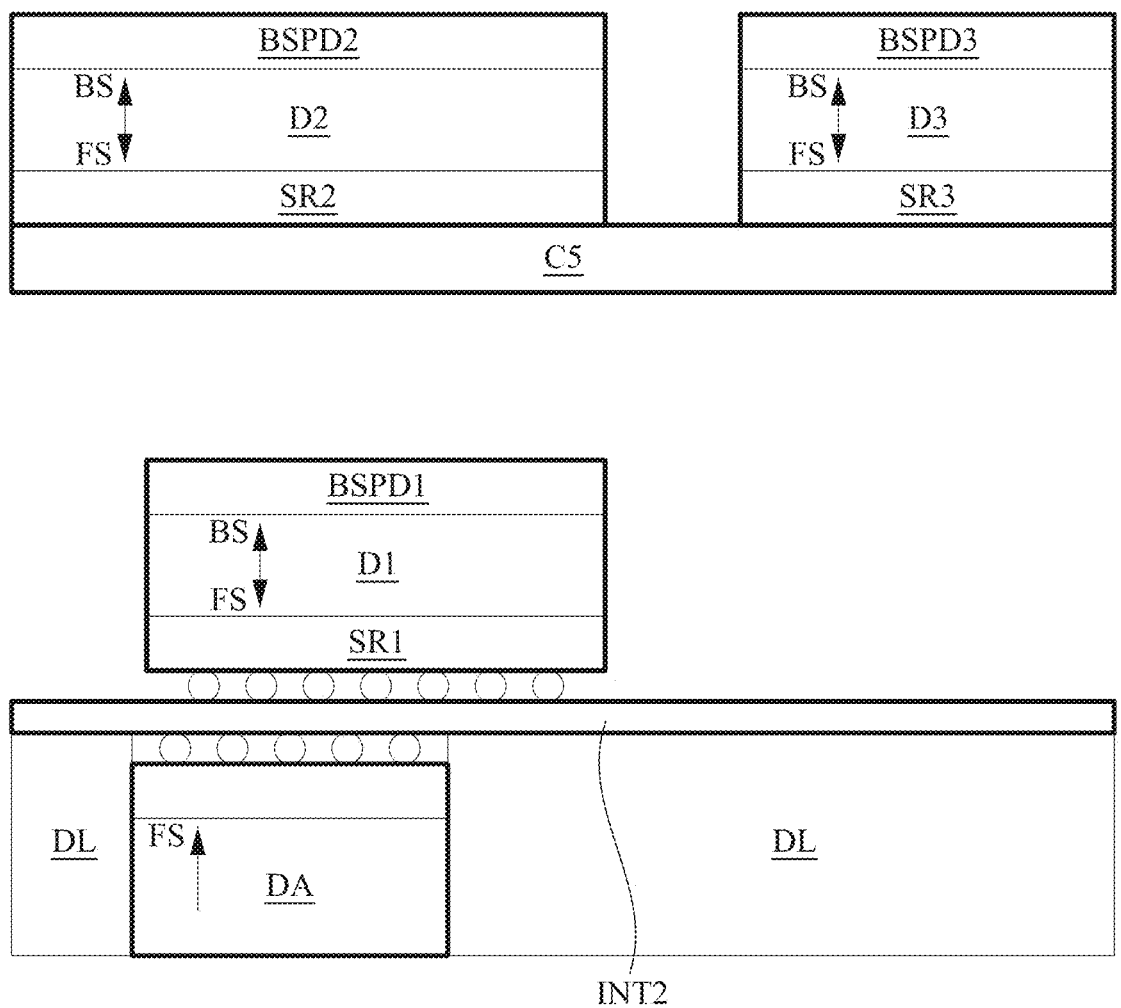
Figure 7C:
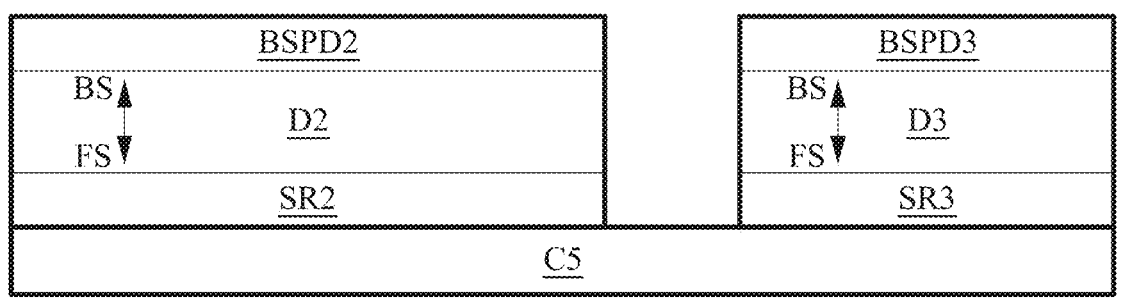
Figure 7C:
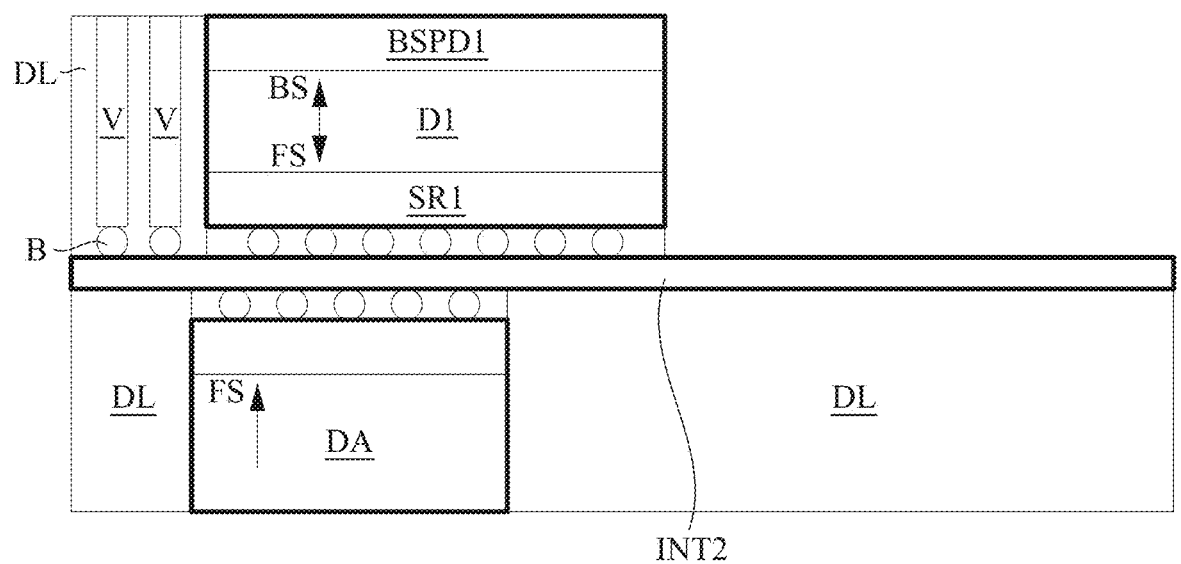
Figure 7C:
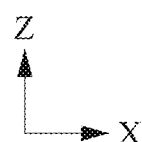
Figure 7D:
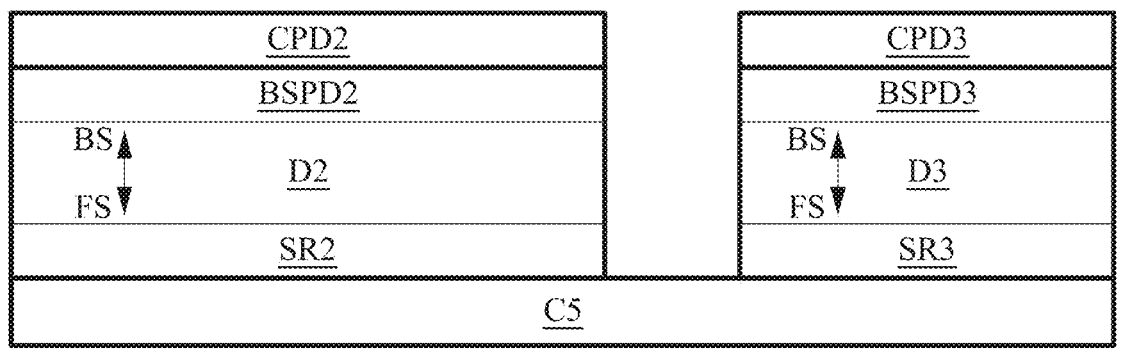
Figure 7D:
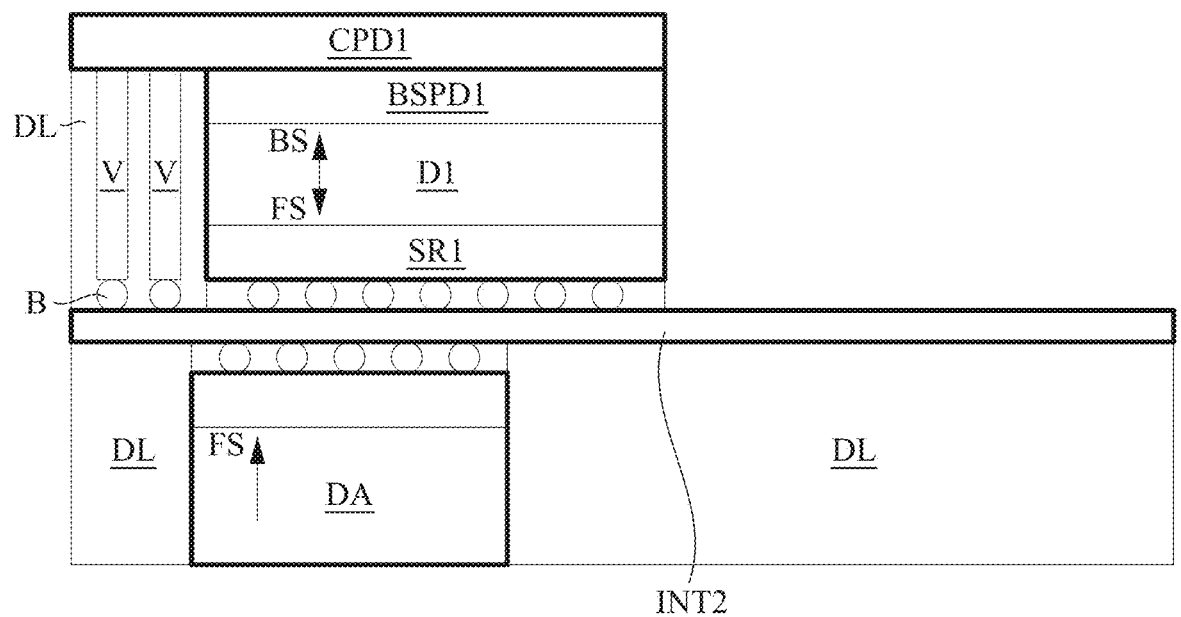
Figure 7E:
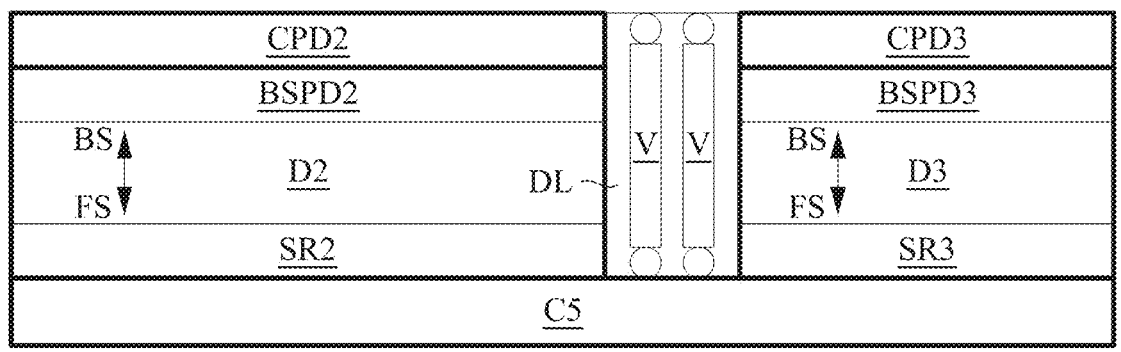
Figure 7E:
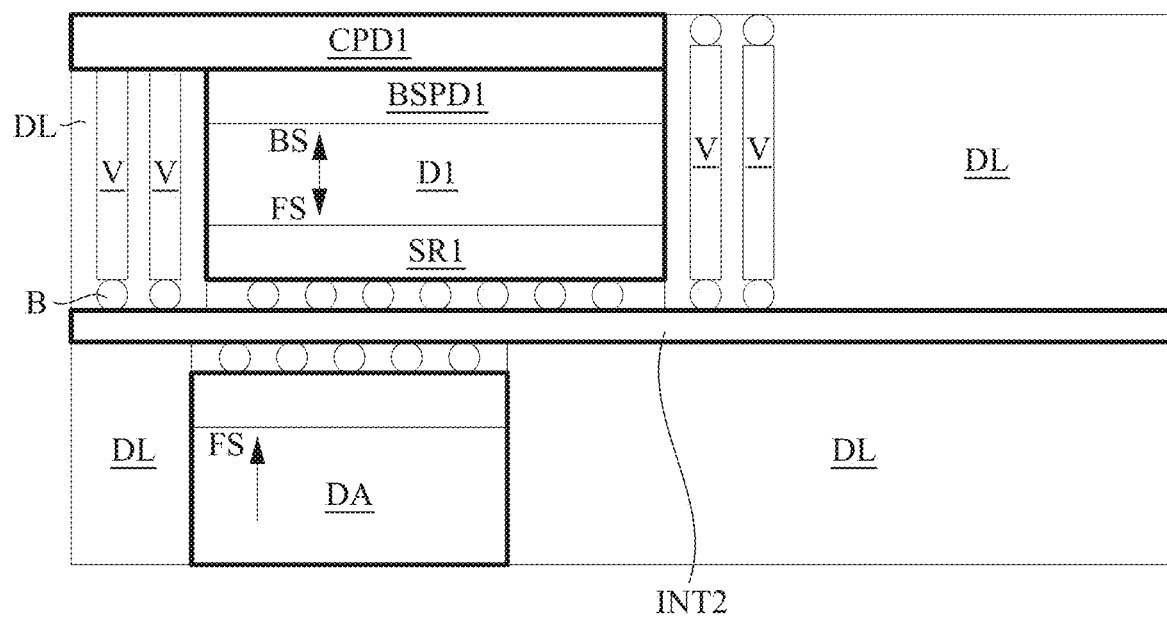
Figure 7F:
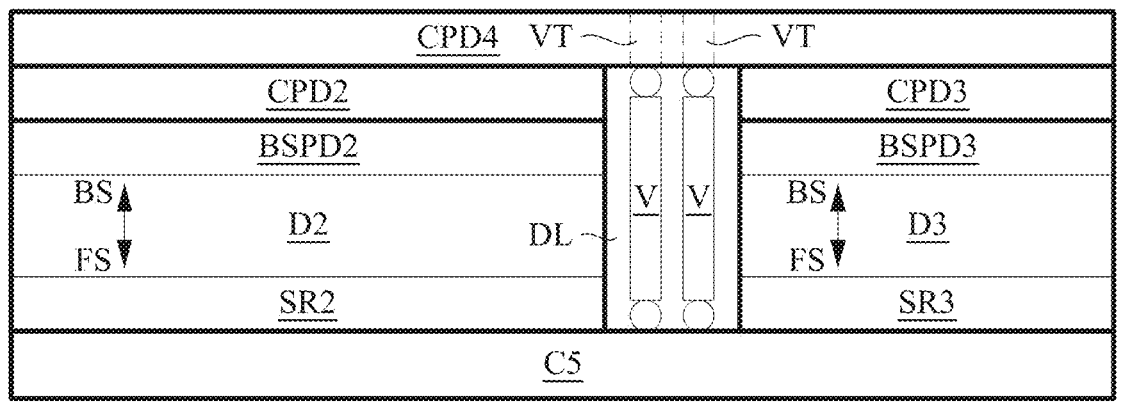
Figure 7F:
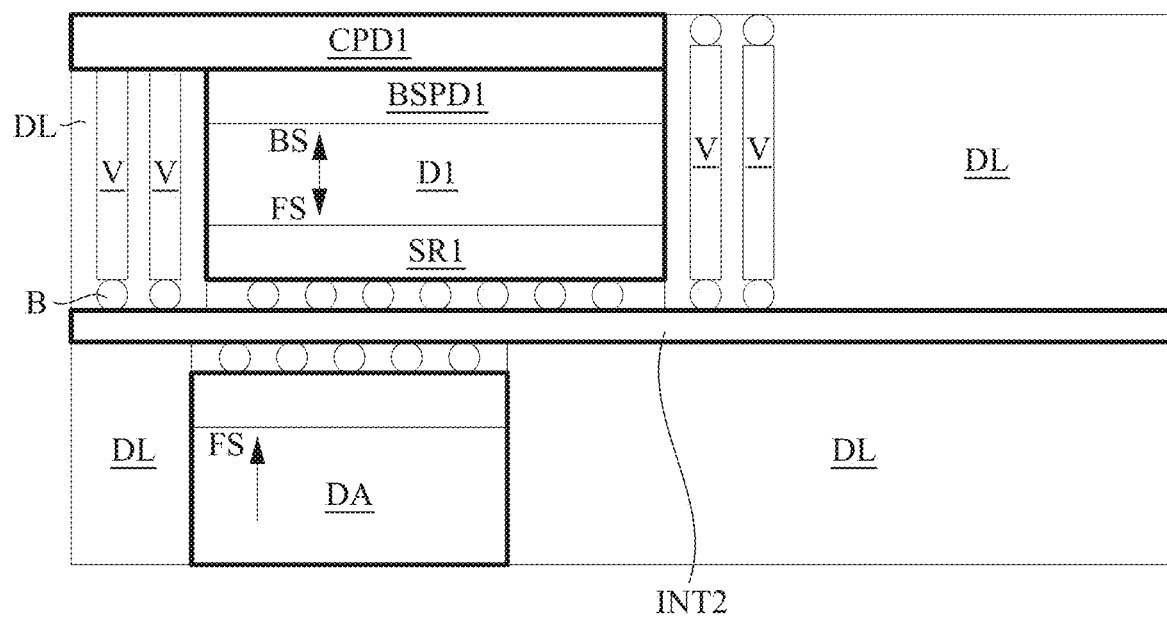
Figure 7F:
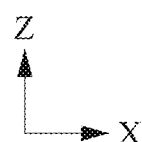
Figure 7G:
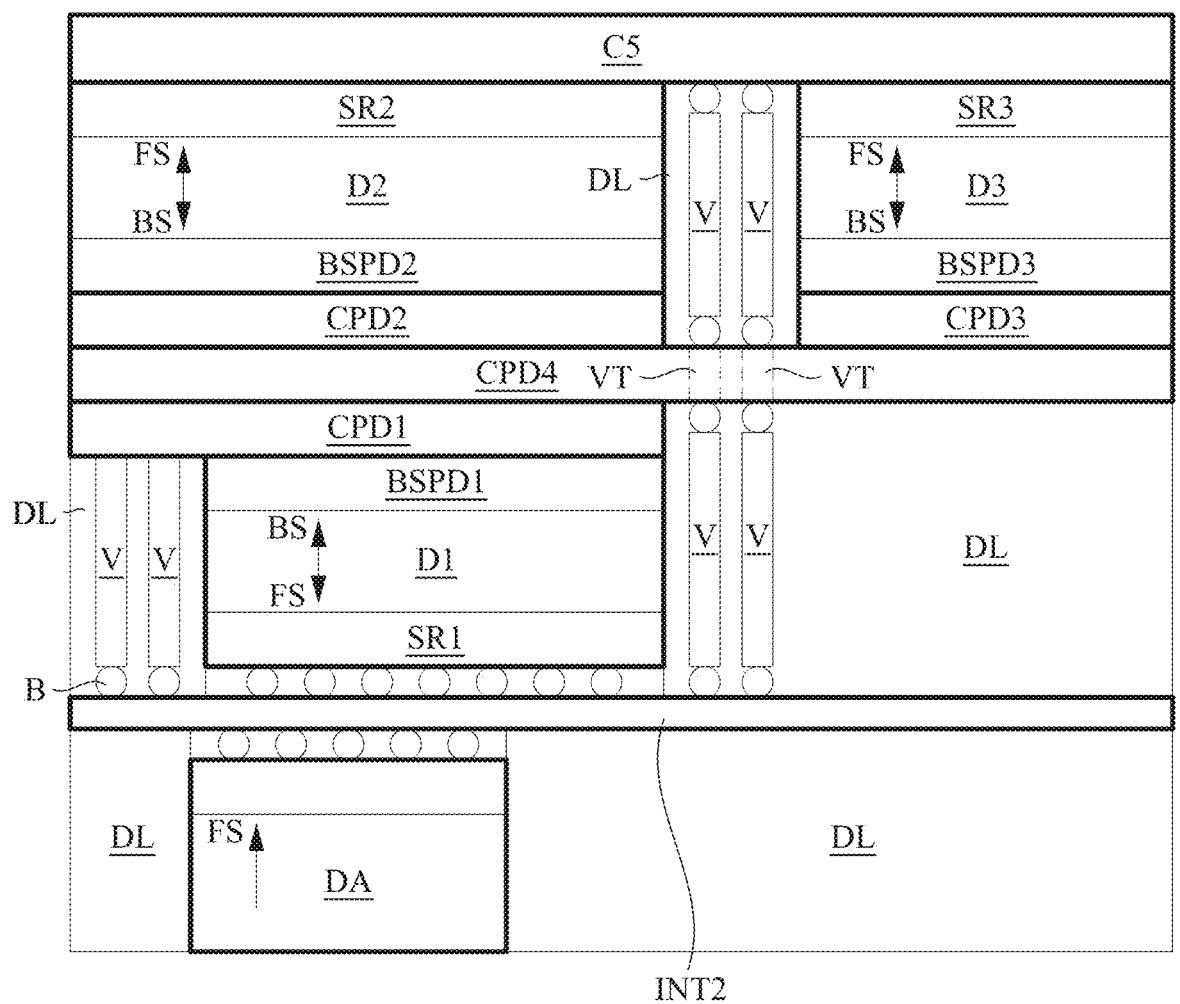
Figure 8:
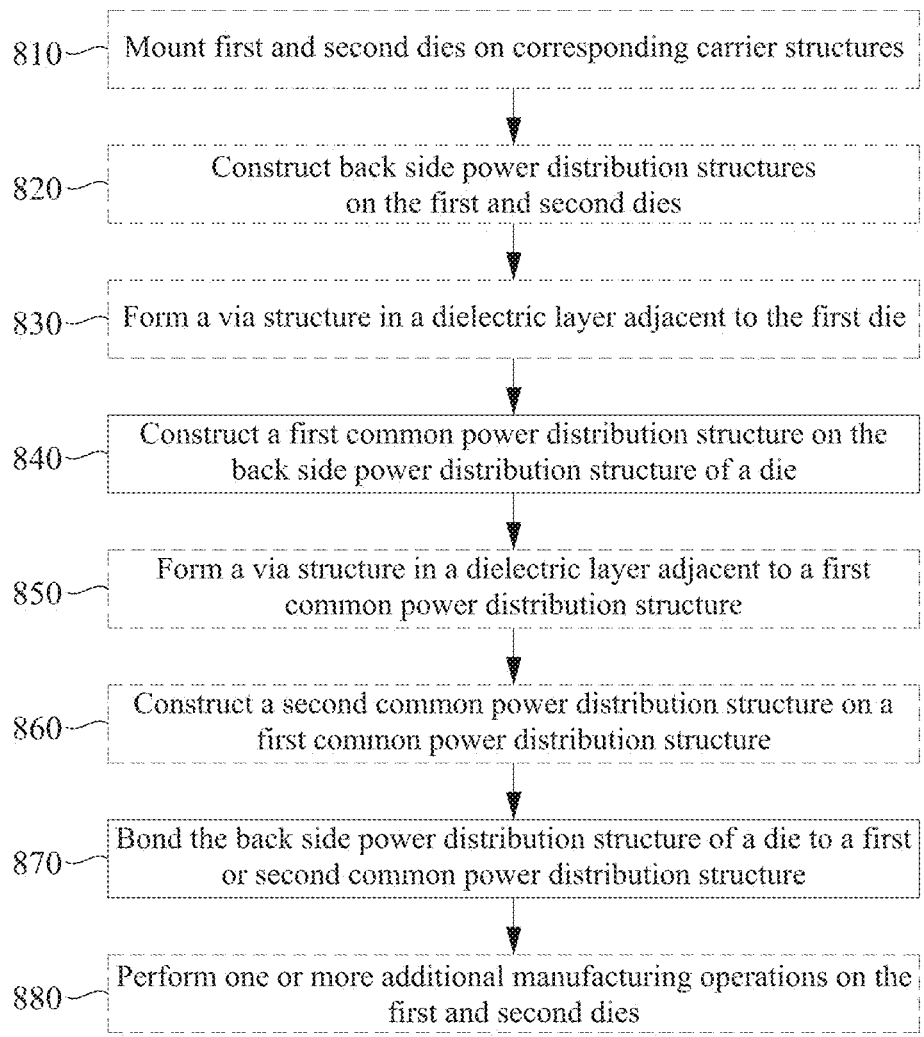
FIG. 8 is a flowchart of a method of forming an IC package, in accordance with some embodiments.

In accordance with various embodiments discussed below, FIGS. 5A-5E are cross-sectional views of intermediate stages in the formation of IC package 100A discussed above with respect to FIG. 1A, FIGS. 6A-6E are cross-sectional views of intermediate stages in the formation of IC package 100B discussed above with respect to FIG. 1B, FIGS. 7A-7G are cross-sectional views of intermediate stages in the formation of IC package 100C discussed above with respect to FIGS. 1Ca and 1Cb, and FIG. 8 is a flowchart of method 800 of forming an IC package, e.g., an IC package 100A-100C.

Figure 5A:
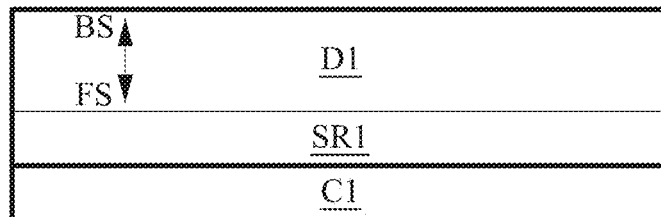
FIGS. 5A-5E are cross-sectional views of intermediate stages in the formation of an IC package, in accordance with some embodiments.
Figure 5A:
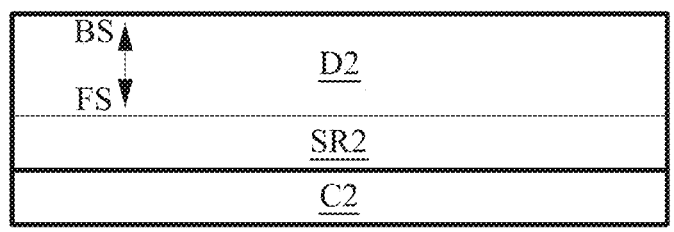
Figure 5A:
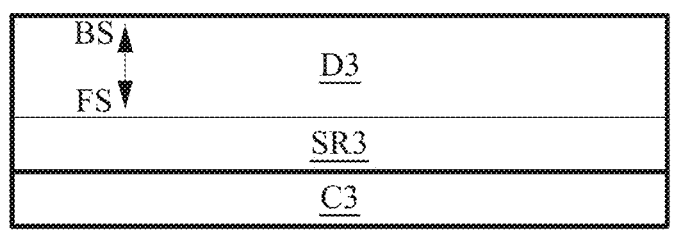
Figure 5A:
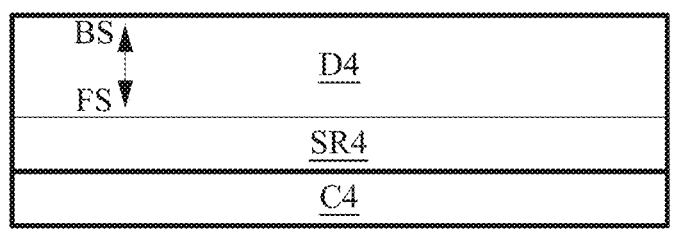

FIG. 5A illustrates dies D1-D4 of IC package 100A mounted on corresponding carrier wafers C1-C4. As depicted in FIG. 5A, the front side FS of each die D1-D4 has been mounted on the respective carrier wafer C1-C4 by bonding the corresponding signal routing structure SR1-SR4 to the respective carrier wafer C1-C4.

A carrier wafer, e.g., a carrier wafer C1-C4, is a substrate having sufficient rigidity, e.g., a semiconductor, glass, or organic material, such that one or more manufacturing operations are able to be performed on one or more dies mounted on the carrier wafer. In some embodiments, a carrier wafer includes one or more signal path connections, e.g., one or more TSV and/or TDV structures, and is thereby capable of providing one or more electrical connections to the one or more dies mounted thereon.

In some embodiments, bonding a die to a carrier wafer includes applying an adhesive layer or film on the carrier wafer. In some embodiments, bonding a die to a wafer carrier includes applying a release film including a polymer-based material, e.g., a light-to-heat-conversion (LTHC) material, capable of being removed in a subsequent operation.

Mounting dies D1-D4 of IC package 100A on carrier wafers C1-C4 corresponds to operation 810 of method 800 illustrated in FIG. 8.

Figure 5B:
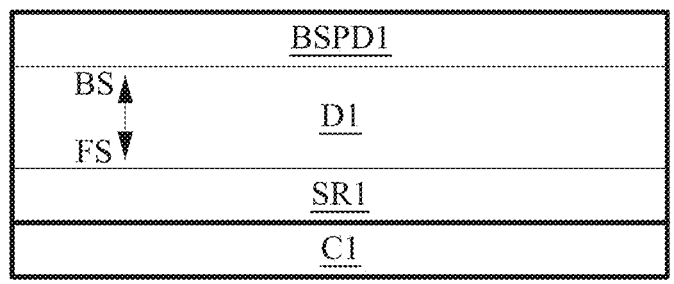
Figure 5B:
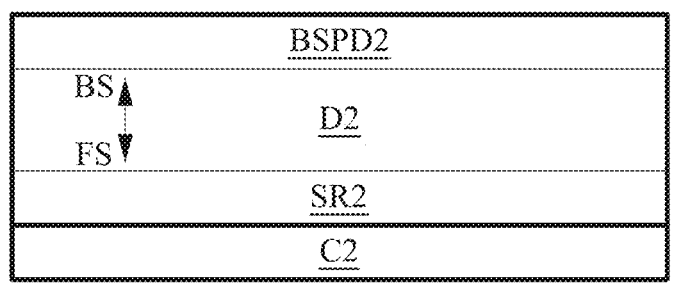
Figure 5B:
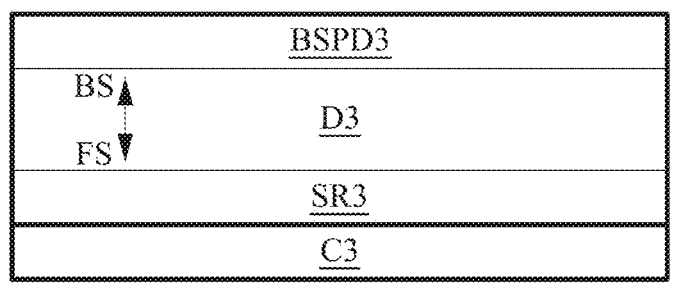
Figure 5B:
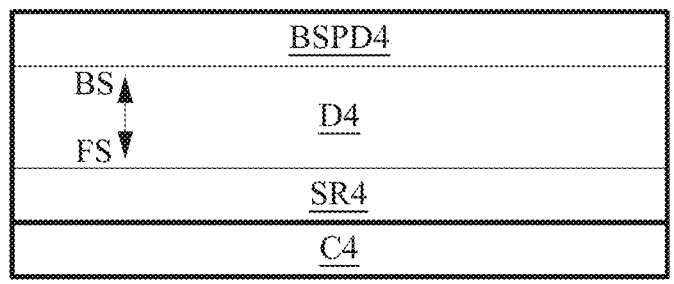

FIG. 5B illustrates dies D1-D4 further including respective back side power distribution structures BSPD1-BSPD4 constructed on the corresponding back sides BS of dies D1-D4 of IC package 100A.

Constructing a power distribution structure, e.g., a back side power distribution structure BSPD1-BSPD4, includes forming a plurality of conductive segments supported and electrically separated by a plurality of insulation layers. In some embodiments, forming an insulation layer includes depositing one or more insulation materials, e.g., dielectric materials, discussed above with respect to FIGS. 1A-3B. In some embodiments, forming a conductive segment includes performing one or more deposition processes to deposit one or more conductive materials as discussed above with respect to FIGS. 1A-3B.

Constructing the power distribution structure includes performing a sequence of operations, each operation in the sequence corresponding to forming a given layer of the power distribution structure, e.g., conductive lines BM0A, BM2A, BM4A, BM6A, BM4B, BM2B, BM0B, BM1A, BM3A, BM5A, BM5B, BM3B, and BM1B and vias VG discussed above with respect to FIGS. 2A and 2B or conductive lines PDL1 and PDL2 and vias VG discussed above with respect to FIGS. 3A and 3B.

In various embodiments, forming a given layer includes depositing and patterning one or more photoresist layers to define a plurality of conductive segments and/or via structures, performing one or more etching and deposition processes to form a volume within an insulation layer including the one or more conductive materials, and performing one or more planarization, and/or cleaning processes.

Constructing the power distribution structure includes performing the sequence of operations whereby the plurality of conductive segments are arranged in accordance with power distribution requirements as discussed above with respect to FIGS. 1A-3B.

Constructing back side power distribution structures BSPD1-BSPD4 on the back sides BS of dies D1-D4 of IC package 100A corresponds to operation 820 of method 800 illustrated in FIG. 8.

Figure 5C:
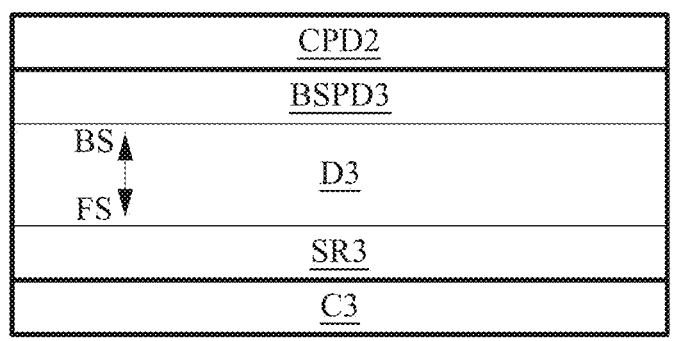
Figure 5C:
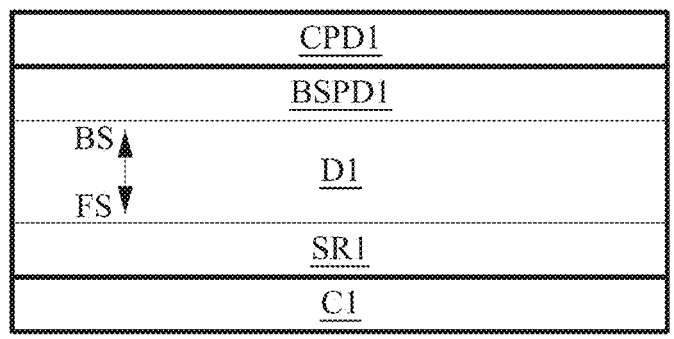
Figure 5C:
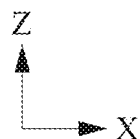

FIG. 5C illustrates dies D1 and D3 of IC package 100A further including respective power distribution structures CPD1 and CPD2 constructed on the corresponding back side power distribution structures BSPD1 and BSPD3.

Constructing a common power distribution structure, e.g., power distribution structure CPD1 or CPD2, is performed in the manner discussed above with respect to constructing a power distribution structure and includes constructing the common power distribution structure electrically connected to a portion or an entirety of the back side power distribution structure. In various embodiments, constructing the common power distribution structure electrically connected to the back side power distribution structure includes constructing the common power distribution structure configured to distribute two or more power voltage levels, e.g., a ground level and a power supply voltage level.

In some embodiments, constructing the common power distribution structure electrically connected to the back side power distribution structure includes forming a mesh structure. In some embodiments, forming the mesh structure includes forming one or more conductive lines having pitches corresponding to pitches of one or more conductive lines of the back side power distribution structure.

Constructing power distribution structures CPD1 and CPD2 of IC package 100A on back side power distribution structures BSPD1 and BSPD3 corresponds to operation 840 of method 800 illustrated in FIG. 8.

Figure 5D:
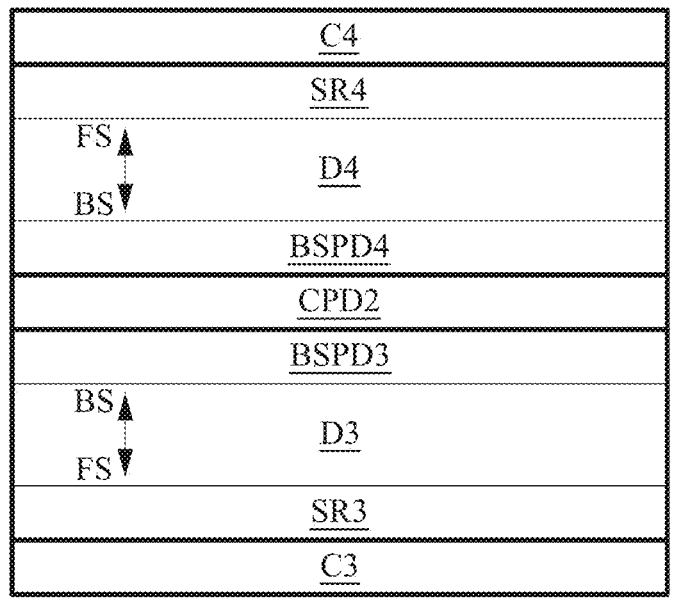
Figure 5D:
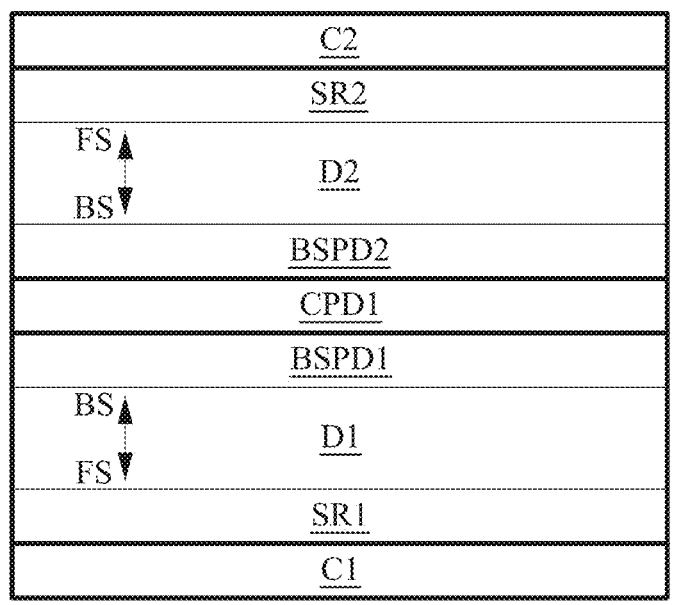

FIG. 5D illustrates IC package 100A including dies D1 and D3 as depicted in FIG. 5C and dies D2 and D4 as depicted in FIG. 5B. As depicted in FIG. 5D, back side power distribution structure BSPD2 of die D2 has been bonded to power distribution structure CPD1, and back side power distribution structure BSPD4 of die D4 has been bonded to power distribution structure CPD2.

Bonding a back side power distribution structure to a common power distribution structure, e.g., bonding back side power distribution structure BSPD2 to power distribution structure CPD1 or back side power distribution structure BSPD4 to power distribution structure CPD2, includes electrically connecting the back side power distribution structure to the common power distribution structure.

In some embodiments, bonding the back side power distribution structure to the common power distribution structure includes mechanically bonding the back side power distribution structure to the common power distribution structure. In some embodiments, mechanically bonding the back side power distribution structure to the common power distribution structure includes performing a thermo-compression operation. In some embodiments, mechanically bonding the back side power distribution structure to the common power distribution structure includes applying one or more adhesive materials to one or both of the back side power distribution structure or the common power distribution structure.

In some embodiments, bonding the back side power distribution structure to the common power distribution structure includes bonding one of back side power distribution structures BSPDA or BSPDB to common power distribution structure CPD as discussed above with respect to FIGS. 2A-3B.

In some embodiments, the back side power distribution structure includes topmost metal segments extending in a first direction and having a first pitch, the common power distribution structure includes topmost metal segments extending in a second direction and having the first pitch, and bonding the back side power distribution structure to the common power distribution structure includes aligning the first direction with the second direction, the topmost metal segments of the back side power distribution structure thereby aligning with the topmost metal segments of the common power distribution structure. In some embodiments, bonding the back side power distribution structure to the common power distribution structure includes bonding conductive lines BSL1 of back side power distribution structure BSPD to conductive lines CPDL1 of common power distribution structure CPD as discussed above with respect to FIGS. 4A and 4C.

In some embodiments, the back side power distribution structure includes topmost metal segments extending in a first direction, the common power distribution structure includes topmost metal segments extending in a second direction, and bonding the back side power distribution structure to the common power distribution structure includes aligning the first direction perpendicular to the second direction, thereby aligning the topmost metal segments of the back side power distribution structure orthogonal to the topmost metal segments of the common power distribution structure. In some embodiments, bonding the back side power distribution structure to the common power distribution structure includes bonding conductive lines BSL1 of back side power distribution structure BSPD to conductive lines CPDL1 of common power distribution structure CPD as discussed above with respect to FIGS. 4B and 4D.

Bonding back side power distribution structures BSPD2 and BSPD4 to power distribution structures CPD1 and CPD2 of IC package 100A corresponds to operation 870 of method 800 illustrated in FIG. 8.

Figure 5E:
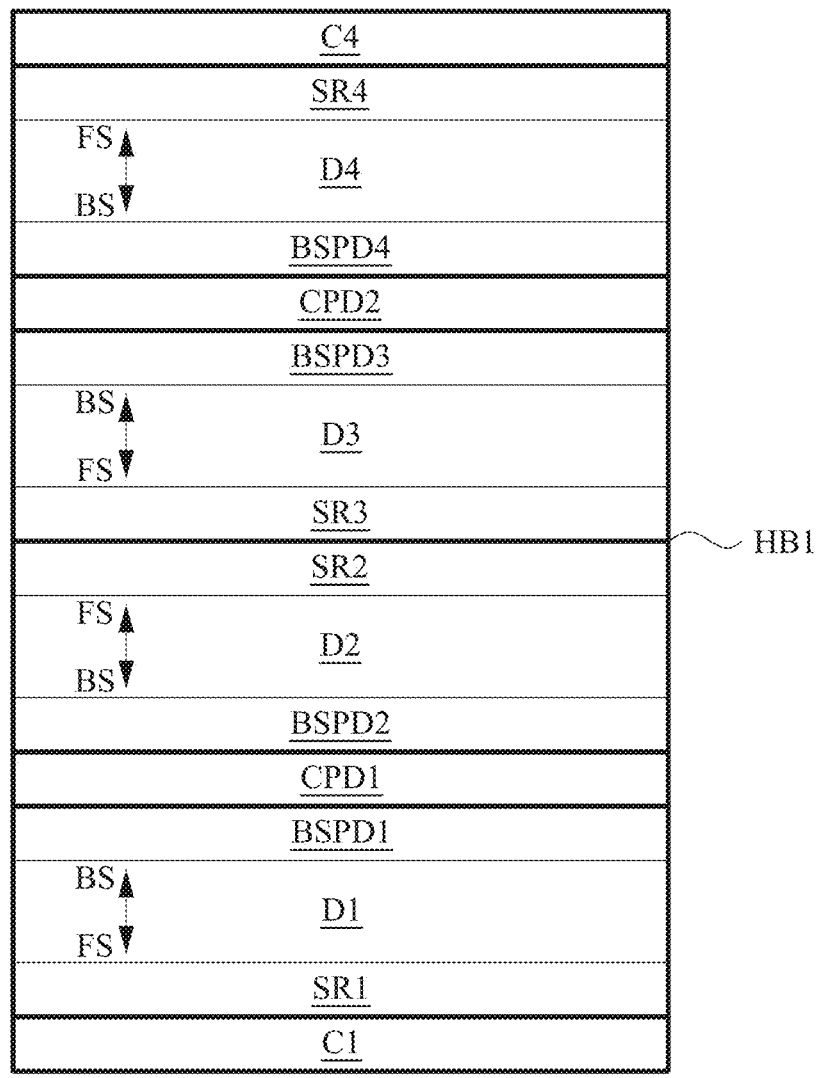

FIG. 5E depicts IC package 100A including dies D1-D4 formed into a die stack by detaching dies D2 and D3 from respective carrier wafers C2 and C3 and bonding dies D2 and D3 to each other at interface HB1.

In various embodiments, detaching a die from a carrier wafer, e.g., detaching die D2 from carrier wafer C2 or die D3 from carrier wafer C3, includes one or more of mechanically separating the die from the carrier wafer or applying heat, e.g., to loosen or release an adhesive layer.

Bonding dies to each other includes forming an interface between signal routing structures on front sides of adjacent dies e.g., by performing a hybrid or other bonding operation including applying a sealing layer and/or forming a plurality of solder bumps to form interface HB1 between signal routing structures SR2 and SR3, thereby bonding dies D2 and D3 to each other.

IC package 100A discussed above with respect to FIG. 1A corresponds to the depiction of FIG. 5E after dies D1 and D4 have been detached from respective carrier wafers C1 and C4.

Forming the die stack by detaching dies D1-D4 from carrier wafers C1-C4 and bonding dies D2 and D3 of IC package 100A to each other corresponds to operation 880 of method 800 illustrated in FIG. 8.

Figure 6A:
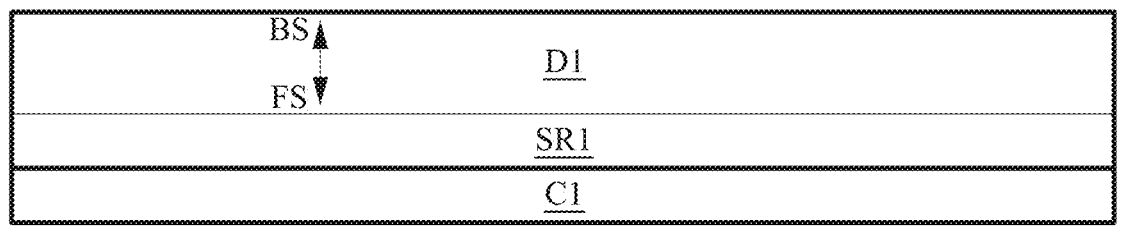
FIGS. 6A-6E are cross-sectional views of intermediate stages in the formation of an IC package, in accordance with some embodiments.
Figure 6A:
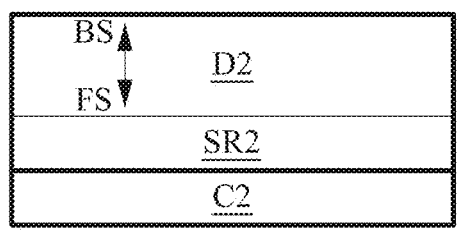
Figure 6A:
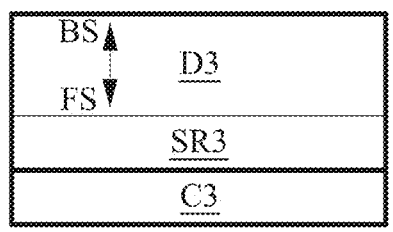
Figure 6A:
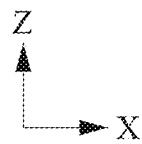

FIG. 6A illustrates dies D1-D3 of IC package 100B mounted on corresponding carrier wafers C1-C3. As depicted in FIG. 6A, the front side FS of each die D1-D3 has been mounted on the respective carrier wafer C1-C3 by bonding the corresponding signal routing structure SR1-SR3 to the respective carrier wafer C1-C3 in the manner discussed above with respect to FIG. 5A.

Mounting dies D1-D3 of IC package 100B on carrier wafers C1-C3 corresponds to operation 810 of method 800 illustrated in FIG. 8.

Figure 6B:
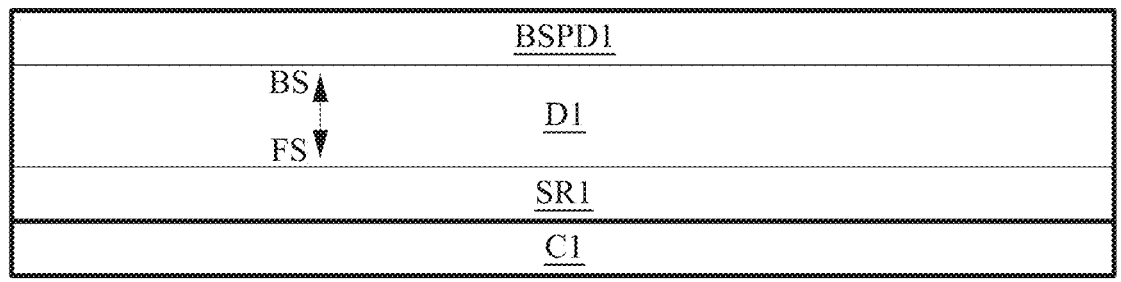
Figure 6B:
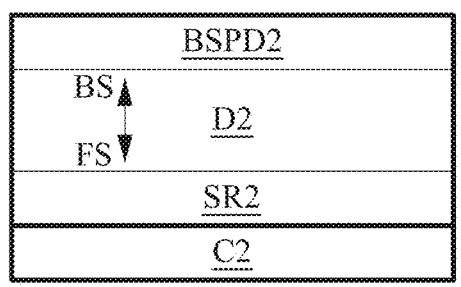
Figure 6B:
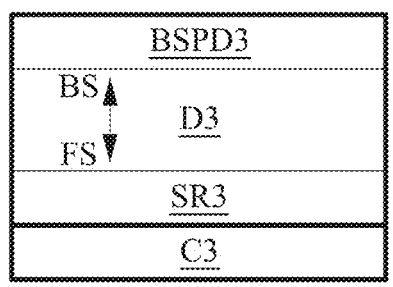
Figure 6B:
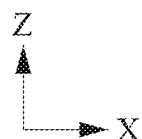

FIG. 6B illustrates dies D1-D3 of IC package 100B further including respective back side power distribution structures BSPD1-BSPD3 constructed on the corresponding back sides BS of dies D1-D3 in the manner discussed above with respect to FIG. 5B.

Constructing back side power distribution structures BSPD1-BSPD3 on the back sides BS of dies D1-D3 of IC package 100B corresponds to operation 820 of method 800 illustrated in FIG. 8.

Figure 6C:
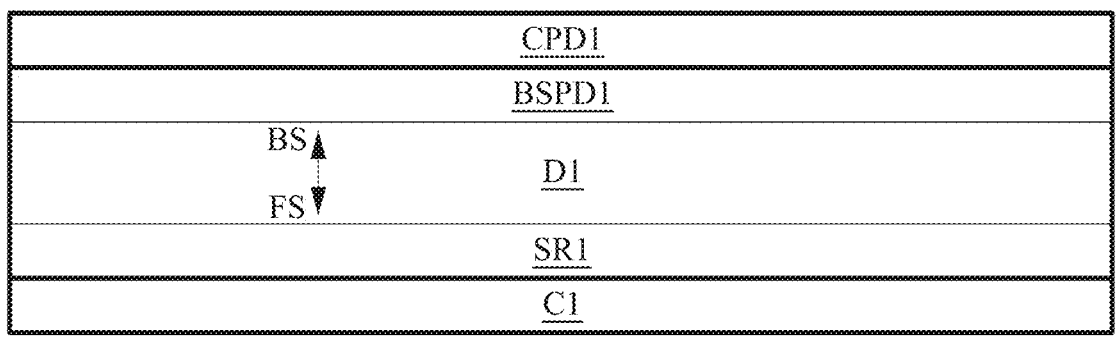
Figure 6C:
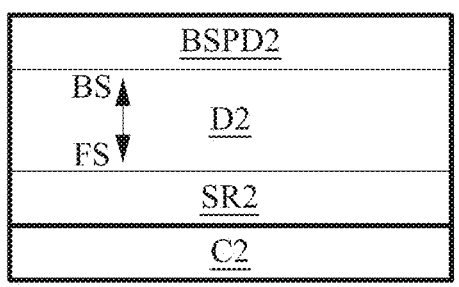
Figure 6C:
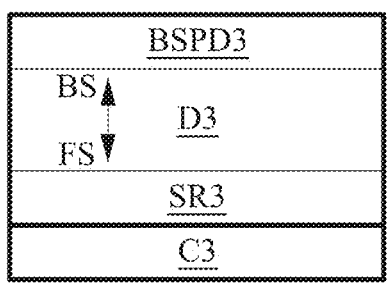
Figure 6C:
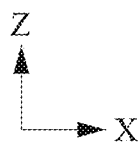

FIG. 6C illustrates dies D1-D3 of IC package 100B with die D1 further including power distribution structure CPD1 constructed on back side power distribution structure BSPD1 in the manner discussed above with respect to FIG. 5C.

Constructing power distribution structure CPD1 of IC package 100B on back side power distribution structure BSPD1 corresponds to operation 840 of method 800 illustrated in FIG. 8.

Figure 6D:
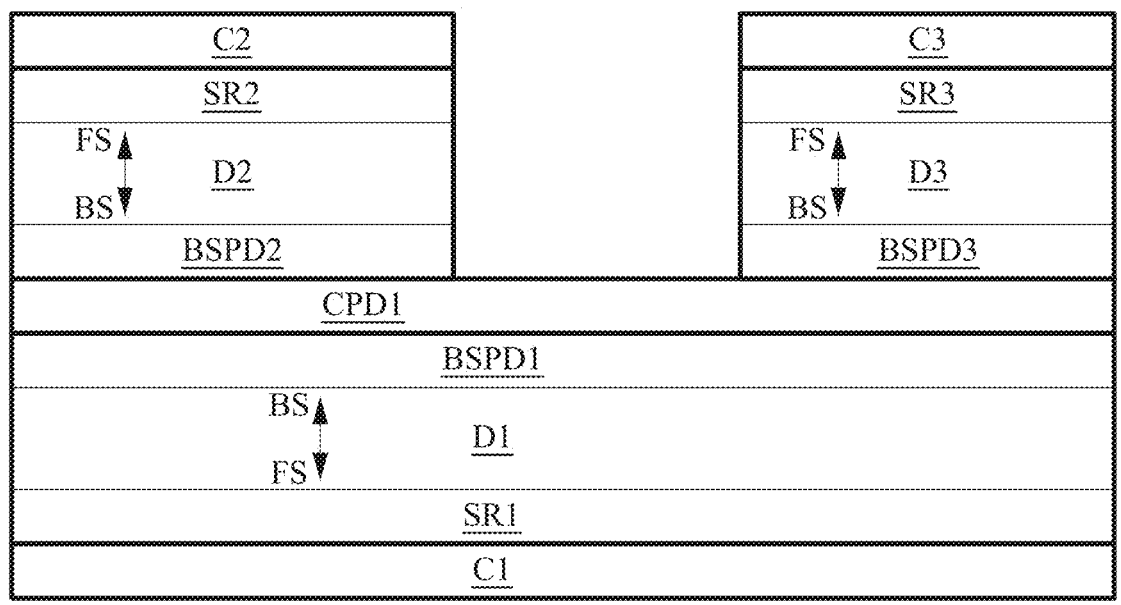

FIG. 6D illustrates IC package 100B including each of back side power distribution structures BSPD2 of die D2 and BSPD3 of die D3 bonded to power distribution structure CPD1 in the manner discussed above with respect to FIG. 5D.

Bonding back side power distribution structures BSPD2 and BSPD3 to power distribution structure CPD1 of IC package 100B corresponds to operation 870 of method 800 illustrated in FIG. 8.

Figure 6E:
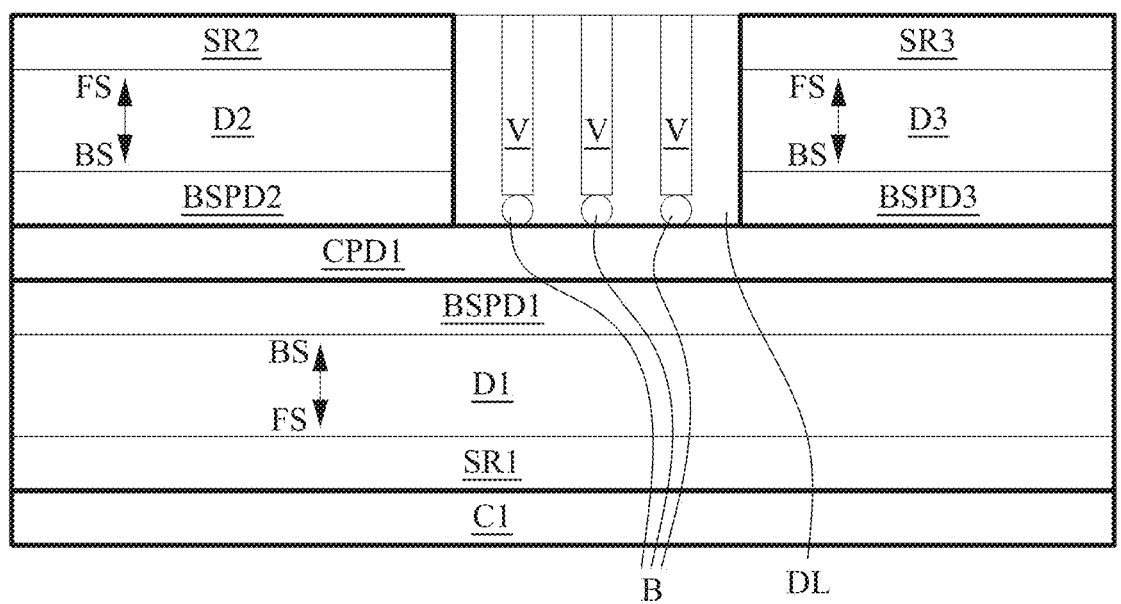

FIG. 6E depicts IC package 100B including dies D2 and D3 detached from respective carrier wafers C2 and C3 and further including connecting bumps B, insulation layer DL, and via structures V formed on power distribution structure CPD1.

Forming a connecting bump, e.g., a connecting bump B, includes forming a volume including one or more conductive materials as discussed above with respect to FIG. 1B. Forming the volume includes forming the volume directly contacting the power distribution structure, e.g., power distribution structure CPD1, thereby electrically connecting the connecting bump to the power distribution structure.

Forming an insulation layer, e.g., insulation layer DL, includes performing one or more deposition processes whereby a volume is caused to include one or more dielectric materials as discussed above with respect to FIG. 1A.

Forming a via structure, e.g., a via structure V, includes performing one or more etching processes and one or more deposition processes whereby a volume within an insulation layer is caused to include one or more conductive materials as discussed above with respect to FIG. 1A.

In the embodiment depicted in FIG. 6E, via structures V are formed directly contacting connecting bumps B, thereby electrically connecting via structures V to power distribution structure CPD1. In some embodiments, IC package 100B does not include connecting bumps B directly contacting power distribution structure CPD1, and via structures V are formed directly contacting power distribution structure CPD1, thereby electrically connecting via structures V to power distribution structure CPD1.

IC package 100B discussed above with respect to FIG. 1B corresponds to the depiction of FIG. 6E after substrate INT1 has been attached and electrically connected to dies D2 and D3 and via structures V through additional connecting bumps B.

Detaching dies D2 and D3 from carrier wafers C2 and C3, forming connecting bumps B, insulation layer DL, and via structures V on power distribution structure CPD1, and attaching substrate INT1 correspond to operation 880 of method 800 illustrated in FIG. 8.

FIG. 7A illustrates die D1 of IC package 100C mounted on substrate INT2, and each of dies D2 and D3 mounted on carrier wafer C5. Substrate INT2 is attached to die DA through connecting bumps B, and in some embodiments substrate INT2 attached to die DA is referred to as a carrier structure.

As depicted in FIG. 7A, the front side FS of die D1 has been mounted on substrate INT2 by being attached to substrate INT2 through connecting bumps B, and each of dies D2 and D3 has been mounted on carrier wafer C5 by bonding the corresponding signal routing structure SR2 or SR3 to carrier wafer C5 in the manner discussed above with respect to FIG. 5A.

Mounting dies D1-D3 of IC package 100C on substrate INT2 and carrier wafer C5 corresponds to operation 810 of method 800 illustrated in FIG. 8.

FIG. 7B illustrates dies D1-D3 of IC package 100C further including respective back side power distribution structures BSPD1-BSPD3 constructed on the corresponding back sides BS of dies D1-D3 in the manner discussed above with respect to FIG. 5B.

Constructing back side power distribution structures BSPD1-BSPD3 on the back sides BS of dies D1-D3 of IC package 100C corresponds to operation 820 of method 800 illustrated in FIG. 8.

FIG. 7C illustrates IC package 100C further including connecting bumps B, insulation layer DL, and via structures V formed on substrate INT2 in the manner discussed above with respect to FIG. 6E.

Forming connecting bumps B, insulation layer DL, and via structures V on substrate INT2 of IC package 100C corresponds to operation 830 of method 800 illustrated in FIG. 8.

FIG. 7D illustrates IC package 100C with dies D1-D3 further including respective power distribution structures CPD1-CPD3 constructed on corresponding back side power distribution structures BSPD1-BSPD3 in the manner discussed above with respect to FIG. 5C.

In the embodiment depicted in FIG. 7D, constructing power distribution structure CPD1 on back side power distribution structure BSPD1 includes constructing power distribution structure CPD1 on insulation layer DL and via structures V, thereby electrically connecting power distribution structure CPD1 to via structures V. In some embodiments, IC package 100C does not include insulation layer DL and via structures V, and constructing power distribution structure CPD1 does not include constructing power distribution structure CPD1 on insulation layer DL and via structures V.

In some embodiments, IC package 100C does not include some or all of power distribution structures CPD1-CPD3, and constructing power distribution structures CPD1-CPD3 includes constructing a subset or none of power distribution structures CPD1-CPD3.

Constructing power distribution structures CPD1-CPD3 of IC package 100C on back side power distribution structures BSPD1-BSPD3 corresponds to operation 840 of method 800 illustrated in FIG. 8.

FIG. 7E illustrates IC package 100C further including connecting bumps B, insulation layer DL, and via structures V formed on substrate INT2 and carrier wafer C5 in the manner discussed above with respect to FIG. 6E.

Forming connecting bumps B, insulation layer DL, and via structures V on substrate INT2 and carrier wafer C5 of IC package 100C corresponds to operation 850 of method 800 illustrated in FIG. 8.

FIG. 7F illustrates IC package 100C further including power distribution structure CPD4 constructed on power distribution structures CPD2 and CPD3, insulation layer DL, and via structures V, thereby electrically connecting power distribution structure CPD4 to each of back side power distribution structures BSPD2 and BSPD3. In some embodiments, IC package 100C does not include one or both of power distribution structures CPD2 or CPD3, and power distribution structure CPD4 is constructed on the corresponding one or both of back side power distribution structures BSPD2 or BSPD3, thereby electrically connecting power distribution structure CPD4 to each of back side power distribution structures BSPD2 and BSPD3.

In the embodiment depicted in FIG. 7F, constructing power distribution structure CPD4 includes constructing via structures VT electrically connected to connecting bumps B and via structures V. Constructing power distribution structure CPD4 including via structures VT is performed in the sequential manner discussed above with respect to FIG. 5C, in which forming each layer of conductive segments and via structures further includes forming portions of via structures VT. Because each operation in the sequence of operations includes forming the portions of via structures VT, performing the sequence of operations forms via structures VT as continuous structures extending along the Z direction, as discussed above with respect to FIGS. 2B and 3B.

In some embodiments, constructing power distribution structure CPD4 includes constructing power distribution structure CPD4 on power distribution structure CPD1 or back side power distribution structure BSPD1 instead of on power distribution structures CPD2 and CPD3, thereby electrically connecting power distribution structure CPD4 to back side power distribution structure BSPD1.

Constructing power distribution structure CPD4 of IC package 100C on power distribution structures CPD2 and CPD3, insulation layer DL, and via structures V corresponds to operation 860 of method 800 illustrated in FIG. 8.

In some embodiments, IC package 100C does not include power distribution structures CPD1-CPD3, and constructing power distribution structure CPD4 corresponds to operation 840 of method 800 illustrated in FIG. 8.

FIG. 7G illustrates IC package 100C including power distribution structure CPD1, and thereby back side power distribution structure BSPD1, bonded to power distribution structure CPD4 in the manner discussed above with respect to FIG. 5D. In some embodiments, IC package 100C does not include power distribution structure CPD1, and back side power distribution structure BSPD1 is bonded directly to power distribution structure CPD4 in the manner discussed above with respect to FIG. 5D.

In some embodiments, power distribution structure CPD4 is formed on power distribution structure CPD1, and power distribution structures CPD2 and CPD3, and thereby back side power distribution structures BSPD2 and BSPD3, are bonded to power distribution structure CPD4 in the manner discussed above with respect to FIG. 5D, or back side power distribution structures BSPD2 and BSPD3 are directly bonded to power distribution structure CPD4 in the manner discussed above with respect to FIG. 5D.

Bonding back side power distribution structures BSPD2 and BSPD3 to power distribution structure CPD4 of IC package 100C corresponds to operation 870 of method 800 illustrated in FIG. 8.

The embodiment of IC package 100C discussed above with respect to FIG. 1Ca corresponds to the depiction of FIG. 7G after carrier wafer C5 has been detached and substrate INT1 has been attached and electrically connected to dies D2 and D3 and via structures V through additional connecting bumps B. The embodiment of IC package 100C discussed above with respect to FIG. 1Cb corresponds to the depiction of FIG. 7G after substrate INT1 has been attached and electrically connected to dies D2 and D3 and via structures V through carrier wafer C5 and additional connecting bumps B.

Detaching dies D2 and D3 from carrier wafer C5, forming connecting bumps B, and attaching substrate INT1 correspond to operation 880 of method 800 illustrated in FIG. 8.

In the embodiment depicted in FIG. 8, the sequence in which the operations of method 800 are ordered is for illustration only; the operations of method 800 are capable of being executed simultaneously or in sequences that differ from that depicted in FIG. 8. In some embodiments, operations in addition to those depicted in FIG. 8 are performed before, between, during, and/or after the operations depicted in FIG. 8.

In various embodiments, one or more operations of method 800 are executed using various fabrication tools, e.g., one or more of a wafer stepper, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

At operation 810, in some embodiments, first and second dies are mounted on corresponding carrier structures. In various embodiments, mounting the first and second dies on the corresponding carrier structures includes mounting dies D1-D4 of IC package 100A on carrier wafers C1-C4 as discussed above with respect to FIG. 5A; mounting dies D1-D3 of IC package 100B on carrier wafers C1-C3 as discussed above with respect to FIG. 6A; or mounting die D1 on substrate INT2 and dies D2 and D3 on carrier wafer C5 of IC package 100C as discussed above with respect to FIG. 7A.

At operation 820, in some embodiments, back side power distribution structures are constructed on the first and second dies. In various embodiments, constructing the back side power distribution structures on the first and second dies includes constructing back side power distribution structures BSPD1-BSPD4 on dies D1-D4 of IC package 100A as discussed above with respect to FIG. 5B; constructing back side power distribution structures BSPD1-BSPD3 on dies D1-D3 of IC package 100B as discussed above with respect to FIG. 6B; or constructing back side power distribution structures BSPD1-BSPD3 on dies D1-D3 of IC package 100C as discussed above with respect to FIG. 7B.

In various embodiments, the first and second dies are included in a plurality of dies, e.g., a wafer, and constructing the back side power distribution structures on the first and second dies includes constructing back side power distribution structures on corresponding dies of the plurality of dies.

At operation 830, in some embodiments, a via structure is formed adjacent to the first die. In some embodiments, forming the via structure adjacent to the first die includes forming via structures V adjacent to die D1 of IC package 100C as discussed above with respect to FIG. 7C.

At operation 840, a common power distribution structure is constructed on the back side power distribution structure of a die. In various embodiments, constructing the common power distribution structure on the back side power distribution structure of a die includes constructing power distribution structures CPD1 and CPD2 on back side power distribution structures BSPD1 and BSPD3 of dies D1 and D3 of IC package 100A as discussed above with respect to FIG. 5C; constructing power distribution structure CPD1 on back side power distribution structure BSPD1 of die D1 of IC package 100B as discussed above with respect to FIG. 6C; constructing one or more of power distribution structures CPD1-CPD3 on back side power distribution structures BSPD1-BSPD3 of dies D1-D3 of IC package 100C as discussed above with respect to FIG. 7D; or constructing power distribution structure CPD4 on one or more of back side power distribution structures BSPD1-BSPD3 of dies D1-D3 of IC package 100C as discussed above with respect to FIG. 7F.

At operation 850, a via structure is formed adjacent to a common power distribution structure. In some embodiments, forming the via structure adjacent to the common power distribution structure includes forming via structures V adjacent to one or more of power distribution structures CPD1-CPD3 of IC package 100C as discussed above with respect to FIG. 7E.

At operation 860, in some embodiments, a second common power distribution structure is constructed on a first common power distribution structure. In some embodiments, constructing the second common power distribution structure on the first common power distribution structure includes constructing power distribution structure CPD4 on one or more of power distribution structures CPD1-CPD3 of IC package 100C as discussed above with respect to FIG. 7F.

At operation 870, the back side power distribution structure of a die is bonded to a first or second common power distribution structure of the IC package. Bonding the back side power distribution structure of the die to the first or second common power distribution structure of the IC package includes electrically connecting the back side power distribution structure of the die to the first or second common power distribution structure.

In various embodiments, bonding the back side power distribution structure of the die to the first or second common power distribution structure includes bonding back side power distribution structures BSPD2 and BSPD4 of dies D2 and D4 to power distribution structures CPD1 and CPD2 of IC package 100A as discussed above with respect to FIG. 5D; bonding back side power distribution structures BSPD2 and BSPD3 of dies D2 and D3 to power distribution structure CPD1 of IC package 100B as discussed above with respect to FIG. 6D; or bonding one or more of back side power distribution structures BSPD1-BSPD3 of dies D1-D3 to power distribution structure CPD4 of IC package 100C as discussed above with respect to FIG. 7G.

At operation 880, in some embodiments, one or more additional manufacturing operations are performed on the first and second dies of the IC package. In various embodiments, performing the one or more additional manufacturing operations includes constructing one or more IC package components in addition to those discussed above with respect to operations 810-870, e.g., one or more insulation layers DL, via structures V, and/or connective bumps B as discussed above with respect to FIGS. 1A-1Cb and 5A-7G, or the like.

In various embodiments, performing the one or more additional manufacturing operations includes performing one or more of a deposition operation, a removal operation, e.g., from a carrier wafer, a soldering operation, a curing operation, an encapsulation operation, or the like.

In various embodiments, performing the one or more additional manufacturing operations includes forming a die stack by detaching dies D1-D4 from carrier wafers C1-C4 and bonding dies D2 and D3 of IC package 100A to each other as discussed above with respect to FIGS. 5E and 1A; detaching dies D2 and D3 from carrier wafers C2 and C3, forming connecting bumps B, insulation layer DL, and via structures V on common power distribution structure CPD1, and attaching substrate INT1 to IC package 100B as discussed above with respect to FIGS. 6E and 1B; or detaching dies D2 and D3 from carrier wafer C5, forming connecting bumps B, and attaching substrate INT1 to IC package 100C as discussed above with respect to FIGS. 7G, 1Ca, and 1Cb.

By executing some or all of the operations of method 800, an IC package, e.g., an IC package 100A-100C is formed including a common power distribution structure electrically connected to back side power distribution structures of each of at least two dies, thereby obtaining the benefits discussed above with respect to IC packages 100A-100C and IC structures depicted in FIGS. 2A-4D.

Figure 9:
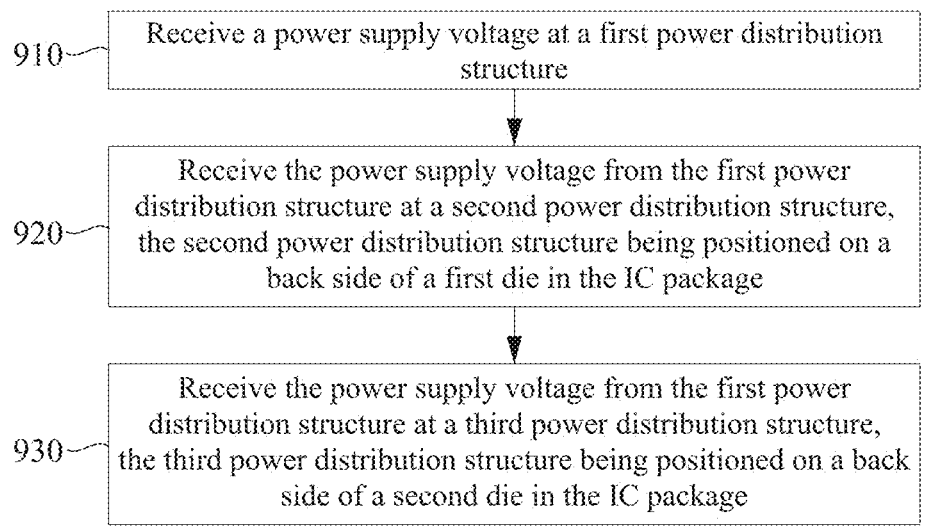
FIG. 9 is a flowchart of a method of distributing power in an IC package, in accordance with some embodiments.

FIG. 9 is a flowchart of a method 900 of distributing power in an IC package, in accordance with some embodiments. Method 900 is usable with an IC package, e.g., an IC package 100A-100C discussed above with respect to FIGS. 1A-1Cb.

The sequence in which the operations of method 900 are depicted in FIG. 9 is for illustration only; the operations of method 900 are capable of being executed in sequences that differ from that depicted in FIG. 9. In some embodiments, operations in addition to those depicted in FIG. 9 are performed before, between, during, and/or after the operations depicted in FIG. 9. In some embodiments, the operations of method 900 are a subset of a method of operating an IC, e.g., a processor, logic, memory, or signal processing circuit, or the like.

At operation 910, a power supply voltage is received at a first power distribution structure in the IC package. Receiving the power supply voltage at the first power distribution structure includes receiving the power supply voltage at a common power distribution structure electrically connected to a second power distribution structure positioned on a back side of a first die in the IC package and to a third power distribution structure positioned on a back side of a second die in the IC package.

In various embodiments, receiving the power supply voltage at the first power distribution structure includes receiving the power supply voltage at one or more of power distribution structures CPD1-CPD4 discussed above with respect to FIGS. 1A-1Cb.

In some embodiments, receiving the power supply voltage at the first power distribution structure includes receiving the power supply voltage at an IC package component electrically connected to the first power distribution structure. In some embodiments, receiving the power supply voltage at the first power distribution structure includes receiving the power supply voltage at a front side of a die, e.g., a die D1-D3 discussed above with respect to FIGS. 1A-1Cb. In some embodiments, receiving the power supply voltage at the first power distribution structure includes receiving the power supply voltage at a substrate, e.g., substrate INT1 discussed above with respect to FIGS. 1B-1Cb or substrate INT2 discussed above with respect to FIGS. 1Ca and 1Cb.

In some embodiments, the power supply voltage is one power supply voltage of a plurality of power supply voltages and receiving the power supply voltage at the power distribution structure includes receiving the plurality of power supply voltages at the first power distribution structure. In some embodiments, receiving the power supply voltage at the power distribution structure includes receiving a reference voltage at the first power distribution structure.

At operation 920, the power supply voltage is received from the first power distribution structure at the second power distribution structure, the second power distribution structure being positioned on the back side of the first die in the IC package. In some embodiments, receiving the power supply voltage from the first power distribution structure at the second power distribution structure includes receiving the power supply voltage at a first one or more of back side power distribution structures BSPD1-BSPD4 of dies D1-D4 discussed above with respect to FIGS. 1A-1Cb.

In some embodiments, the power supply voltage is one power supply voltage of a plurality of power supply voltages and receiving the power supply voltage from the first power distribution structure at the second power distribution structure includes receiving the plurality of power supply voltages from the first power distribution structure at the second power distribution structure. In some embodiments, receiving the power supply voltage from the first power distribution structure at the second power distribution structure includes receiving the reference voltage from the first power distribution structure at the second power distribution structure.

At operation 930, the power supply voltage is received from the first power distribution structure at the third power distribution structure, the third power distribution structure being positioned on the back side of the second die in the IC package.

In some embodiments, receiving the power supply voltage from the first power distribution structure at the third power distribution structure includes receiving the power supply voltage at a second one or more of back side power distribution structures BSPD1-BSPD4 of dies D1-D4 discussed above with respect to FIGS. 1A-1Cb.

In some embodiments, receiving the power supply voltage from the first power distribution structure at the third power distribution structure includes receiving the power supply voltage from the first power distribution structure at a fourth power distribution structure, the fourth power distribution structure being positioned on a back side of a third die in the IC package. In some embodiments, receiving the power supply voltage from the first power distribution structure at the fourth power distribution structure includes receiving the power supply voltage at a third one or more of back side power distribution structures BSPD1-BSPD4 of dies D1-D4 discussed above with respect to FIGS. 1A-1Cb.

In some embodiments, the power supply voltage is one power supply voltage of a plurality of power supply voltages and receiving the power supply voltage from the first power distribution structure at the third power distribution structure includes receiving the plurality of power supply voltages from the first power distribution structure at the third power distribution structure. In some embodiments, receiving the power supply voltage from the first power distribution structure at the third power distribution structure includes receiving the reference voltage from the first power distribution structure at the third power distribution structure.

By executing some or all of the operations of method 900, one or more power supply voltage levels are distributed in an IC package through a common power supply distribution structure electrically connected to power distribution structures positioned on back sides of each of a first and second die, thereby obtaining the benefits discussed above with respect to IC packages 100A-100C and IC structures depicted in FIGS. 2A-4D.

In some embodiments, a method of forming an IC package includes constructing a first power distribution structure on a first die included in the IC package, thereby electrically connecting the first power distribution structure to a second power distribution structure positioned on a back side of the first die, and bonding a third power distribution structure to the first power distribution structure, the third power distribution structure being positioned on a back side of a second die. In some embodiments, constructing the first power distribution structure on the first die includes forming a mesh structure on a mesh structure of the second power distribution structure. In some embodiments, the method includes forming a via structure extending through the mesh structure of the first power distribution structure and electrically isolated from the first power distribution structure. In some embodiments, the third power distribution structure includes topmost metal segments extending in a first direction and having a first pitch, the first power distribution structure includes topmost metal segments extending in a second direction and having the first pitch, and bonding the third power distribution structure to the first power distribution structure includes aligning the first direction with the second direction, the topmost metal segments of the third power distribution structure thereby aligning with the topmost metal segments of the first power distribution structure. In some embodiments, the third power distribution structure includes topmost metal segments extending in a first direction, the first power distribution structure includes topmost metal segments extending in a second direction, and bonding the third power distribution structure to the first power distribution structure includes aligning the first direction perpendicular to the second direction, thereby aligning the topmost metal segments of the third power distribution structure orthogonal to the topmost metal segments of the first power distribution structure. In some embodiments, bonding the third power distribution structure to the first power distribution structure includes performing a thermocompression operation. In some embodiments, the method includes constructing a fourth power distribution structure electrically connected to a fifth power distribution structure positioned on a back side of a third die, bonding a sixth power distribution structure to the fourth power distribution structure, the sixth power distribution structure being positioned on a back side of a fourth die, and including the third die and the fourth die in the IC package. In some embodiments, the method includes bonding a fourth power distribution structure to the first power distribution structure, the fourth power distribution structure being positioned on a back side of a third die. In some embodiments, the method includes constructing a signal routing structure on a front side of the second die, and combining the second die with a carrier such that the carrier is adjacent to the signal routing structure. In some embodiments, the method includes removing the carrier from the signal routing structure, and bonding a substrate to the signal routing structure such that signal path connections are formed between the substrate and the signal routing structure. In some embodiments, the method includes bonding a substrate to the second die such that the carrier is interposed between the signal routing structure and the substrate, signal path connections being formed between the substrate and the signal routing structure, the signal path connections extending through the carrier.

In some embodiments, a method of forming an IC package having a first die and a second die in a back-to-back arrangement includes constructing a first back side power distribution structure on a back side of the first die, constructing a common power distribution structure on the first back side power distribution structure, constructing a second back side power distribution structure on a back side of a second die, disposing the second back side power distribution structure to face the common power distribution structure, and bonding the second back side power distribution structure to the common power distribution structure. In some embodiments, a front side of the first die and a front side of the second die have integrated circuit devices formed thereon. In some embodiments, the method includes at least one of, before constructing the first back side power distribution structure on the back side of the first die, thinning the back side of the first die, or, before constructing the second back side power distribution structure on the back side of the second die, thinning the back side of the second die. In some embodiments, the method includes, before bonding the second back side power distribution structure to the common power distribution structure, constructing a first signal routing structure on a front side of the first die, the front side of the first die facing away from the back side of the first die, combining the first die with a first carrier such that the first carrier is adjacent to the first signal routing structure, constructing a second signal routing structure on a front side of the second die, the front side of the second die facing away from the back side of the second die, and combining the second die with a second carrier such that the second carrier is adjacent to the second signal routing structure. In some embodiments, the constructing the common power distribution structure includes arranging conductive lines in layers, at least some of the conductive lines being interconnected by first via structures. In some embodiments, the constructing the common power distribution structure further includes forming the conductive lines into a mesh structure, the mesh structure having spaces between the conductive lines. In some embodiments, at least some of the spaces are formed in alignment in a thickness direction of the common power distribution structure, and the constructing the common power distribution structure further includes providing second via structures, which extend in the thickness direction, in the spaces, and providing an insulating material in the spaces between the second via structures and the conductive lines.

In some embodiments, a method of distributing power in an IC package includes receiving a power supply voltage at a first power distribution structure in the IC package, receiving the power supply voltage from the first power distribution structure at a second power distribution structure, the second power distribution structure being positioned on a back side of a first die in the IC package, and receiving the power supply voltage from the first power distribution structure at a third power distribution structure, the third power distribution structure being positioned on a back side of a second die in the IC package. In some embodiments, the method includes receiving a reference voltage at the first power distribution structure, receiving the reference voltage from the first power distribution structure at the second power distribution structure, and receiving the reference voltage from the first power distribution structure at the third power distribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit (IC) package, the method comprising:
constructing a first power distribution mesh structure on a first die included in the IC package, thereby electrically connecting the first power distribution mesh structure to a second power distribution mesh structure positioned on a back side of the first die; and
bonding a third power distribution mesh structure to the first power distribution mesh structure, the third power distribution mesh structure being positioned on a back side of a second die, thereby forming a continuous mesh structure comprising the first through third power distribution mesh structures.

2. The method of claim 1, further comprising forming a via structure extending through the first power distribution mesh structure and electrically isolated from the first power distribution mesh structure.

3. The method of claim 1, wherein
the third power distribution mesh structure comprises topmost metal segments extending in a first direction and having a first pitch,
the first power distribution mesh structure comprises topmost metal segments extending in a second direction and having the first pitch, and
the bonding the third power distribution mesh structure to the first power distribution mesh structure comprises aligning the first direction with the second direction, the topmost metal segments of the third power distribution mesh structure thereby aligning with the topmost metal segments of the first power distribution mesh structure.

4. The method of claim 1, wherein
the third power distribution mesh structure comprises topmost metal segments extending in a first direction,
the first power distribution mesh structure comprises topmost metal segments extending in a second direction, and
the bonding the third power distribution mesh structure to the first power distribution mesh structure comprises aligning the first direction perpendicular to the second direction, thereby aligning the topmost metal segments of the third power distribution mesh structure orthogonal to the topmost metal segments of the first power distribution mesh structure.

5. The method of claim 1, wherein the bonding the third power distribution mesh structure to the first power distribution mesh structure comprises performing a thermo-compression operation.

6. The method of claim 1, further comprising:
constructing a fourth power distribution structure electrically connected to a fifth power distribution structure positioned on a back side of a third die;
bonding a sixth power distribution structure to the fourth power distribution structure, the sixth power distribution structure being positioned on a back side of a fourth die; and including the third die and the fourth die in the IC package.

7. The method of claim 1, further comprising bonding a fourth power distribution structure to the first power distribution mesh structure, the fourth power distribution structure being positioned on a back side of a third die.

8. The method of claim 1, further comprising:
constructing a signal routing structure on a front side of the second die; and
combining the second die with a carrier such that the carrier is adjacent to the signal routing structure.

9. The method of claim 8, further comprising:
removing the carrier from the signal routing structure; and
bonding a substrate to the signal routing structure such that signal path connections are formed between the substrate and the signal routing structure.

10. The method of claim 8, further comprising:
bonding a substrate to the second die such that the carrier is interposed between the signal routing structure and the substrate, signal path connections being formed between the substrate and the signal routing structure, the signal path connections extending through the carrier.

11. A method of forming an integrated circuit (IC) package having a first die and a second die in a back-to-back arrangement, the method comprising:
constructing a first back side power distribution mesh structure on a back side of the first die;
constructing a common power distribution mesh structure on the first back side power distribution mesh structure;
constructing a second back side power distribution mesh structure on a back side of a second die;
disposing the second back side power distribution mesh structure to face the common power distribution mesh structure; and
bonding the second back side power distribution mesh structure to the common power distribution mesh structure, thereby forming a continuous mesh structure comprising the first and second back side power distribution mesh structures and the common power distribution mesh structure.

12. The method of claim 11, wherein a front side of the first die and a front side of the second die have integrated circuit devices formed thereon.

13. The method of claim 12, further comprising at least one of:
before constructing the first back side power distribution mesh structure on the back side of the first die, thinning the back side of the first die; or
before constructing the second back side power distribution mesh structure on the back side of the second die, thinning the back side of the second die.

14. The method of claim 11, further comprising, before bonding the second back side power distribution mesh structure to the common power distribution mesh structure:
constructing a first signal routing structure on a front side of the first die, the front side of the first die facing away from the back side of the first die;
combining the first die with a first carrier such that the first carrier is adjacent to the first signal routing structure;
constructing a second signal routing structure on a front side of the second die, the front side of the second die facing away from the back side of the second die; and
combining the second die with a second carrier such that the second carrier is adjacent to the second signal routing structure.

15. The method of claim 11, wherein the constructing the common power distribution mesh structure comprises arranging conductive lines in layers, at least some of the conductive lines being interconnected by first via structures.

16. The method of claim 15, wherein the constructing the common power distribution mesh structure further comprises forming the conductive lines into first and second subsets configured to distribute two separate power voltage levels.

17. The method of claim 15, wherein
the constructing the common power distribution mesh structure further comprises:
providing second via structures, which extend across the layers; and
providing an insulating material in spaces between the second via structures and the conductive lines.

18. A method of distributing power in an integrated circuit (IC) package, the method comprising:
receiving a power supply voltage at a first power distribution mesh structure in the IC package;
receiving the power supply voltage from the first power distribution mesh structure at a second power distribution mesh structure, the second power distribution mesh structure being positioned on a back side of a first die in the IC package; and
receiving the power supply voltage from the first power distribution mesh structure at a third power distribution mesh structure, the third power distribution mesh structure being positioned on a back side of a second die in the IC package,
wherein the receiving the power supply voltage comprises receiving the power supply voltage through a continuous mesh structure comprising the first through third power distribution mesh structures.

19. The method of claim 18, further comprising:
receiving a reference voltage at the first power distribution mesh structure;
receiving the reference voltage from the first power distribution mesh structure at the second power distribution mesh structure; and
receiving the reference voltage from the first power distribution mesh structure at the third power distribution mesh structure.

20. The method of claim 18, further comprising:
receiving the power supply voltage from the first power distribution mesh structure at a fourth power distribution structure, the fourth power distribution structure being positioned on a back side of a third die in the IC package.

* * * * *